United States Patent
Green et al.

(10) Patent No.: US 11,782,102 B2
(45) Date of Patent: Oct. 10, 2023

(54) HALL SENSOR WITH DIELECTRIC ISOLATION AND P-N JUNCTION ISOLATION

(71) Applicant: Texas Instruments Incorporated, Dallas, TX (US)

(72) Inventors: Keith Ryan Green, Prosper, TX (US); Erika Lynn Mazotti, San Martin, CA (US); William David French, San Jose, CA (US); Ricky Alan Jackson, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/508,706

(22) Filed: Oct. 22, 2021

(65) Prior Publication Data

US 2023/0129179 A1     Apr. 27, 2023

(51) Int. Cl.
*G01R 33/07* (2006.01)
*G01R 33/00* (2006.01)
*H10N 52/01* (2023.01)
*H10N 52/80* (2023.01)
*H10N 52/00* (2023.01)

(52) U.S. Cl.
CPC ....... *G01R 33/072* (2013.01); *G01R 33/0052* (2013.01); *G01R 33/077* (2013.01); *H10N 52/01* (2023.02); *H10N 52/101* (2023.02); *H10N 52/80* (2023.02)

(58) Field of Classification Search
CPC .............. G01R 33/072; G01R 33/0052; G01R 33/077; H01L 43/04; H01L 43/14; H01L 43/065
See application file for complete search history.

(56) References Cited

U.S. PATENT DOCUMENTS

| | | | |
|---|---|---|---|
| 6,559,043 B1* | 5/2003 | Tseng | H01L 21/76895 257/E21.59 |
| 7,253,094 B1* | 8/2007 | Zhang | H01L 21/02063 257/E21.507 |
| 9,864,020 B2 | 1/2018 | Herbert | |
| 10,109,787 B2 | 10/2018 | Green et al. | |
| 2005/0230769 A1* | 10/2005 | Lilian | G01R 33/07 257/421 |
| 2017/0271399 A1* | 9/2017 | Lee | H10N 52/101 |
| 2020/0335636 A1* | 10/2020 | Agam | H01L 29/66901 |
| 2021/0003641 A1* | 1/2021 | Vecchi | H10N 52/80 |

* cited by examiner

*Primary Examiner* — Dominic E Hawkins
(74) *Attorney, Agent, or Firm* — Ronald O. Neerings; Frank D. Cimino

(57) ABSTRACT

A microelectronic device has a Hall sensor that includes a Hall plate in a semiconductor material. The Hall sensor includes contact regions in the semiconductor material, contacting the Hall plate. The Hall sensor includes an isolation structure with a dielectric material contacting the semiconductor material, on at least two opposite sides of each of the contact regions. The isolation structure is laterally separated from the contact regions by gaps. The Hall sensor further includes a conductive spacer over the gaps, the conductive spacer being separated from the semiconductor material by an insulating layer.

21 Claims, 21 Drawing Sheets

HALL SENSOR WITH DIELECTRIC ISOLATION AND P-N JUNCTION ISOLATION

FIELD

This disclosure relates to the field of microelectronic devices. More particularly, but not exclusively, this disclosure relates to Hall sensors in microelectronic devices.

BACKGROUND

Hall sensors may be integrated into microelectronic devices to measure magnetic fields. A Hall sensor in a microelectronic device desirably has a high magnetic gain, a low offset and a low noise level, while operating a low bias current. Magnetic gain may be characterized as a ratio of the output of the Hall sensor to the magnetic field strength, normalized to bias current. Offset is the output of the Hall sensor at zero magnetic field. Noise level is the temporal fluctuation of the output of the Hall sensor under constant magnetic field and constant bias current. A low bias current may be characterized by a level that does not degrade long term reliability of the Hall sensor, and does not unduly heat the Hall plate. Furthermore, it is desirable for the Hall sensor to meet these requirements while maintaining low fabrication costs.

SUMMARY

The present disclosure introduces a microelectronic device including a substrate having a semiconductor material. The microelectronic device has a Hall sensor that includes a Hall plate in the semiconductor material. The Hall sensor includes a contact region in the semiconductor material, contacting the Hall plate, and an isolation structure including dielectric material contacting the semiconductor material, on two opposite sides of the contact region, the isolation structure being laterally separated from the contact region by a gap. The Hall sensor further includes a conductive spacer of electrically conductive material over the gap, the conductive spacer being separated from the semiconductor material by an insulating layer.

DETAILED DESCRIPTION

Figure 1A:
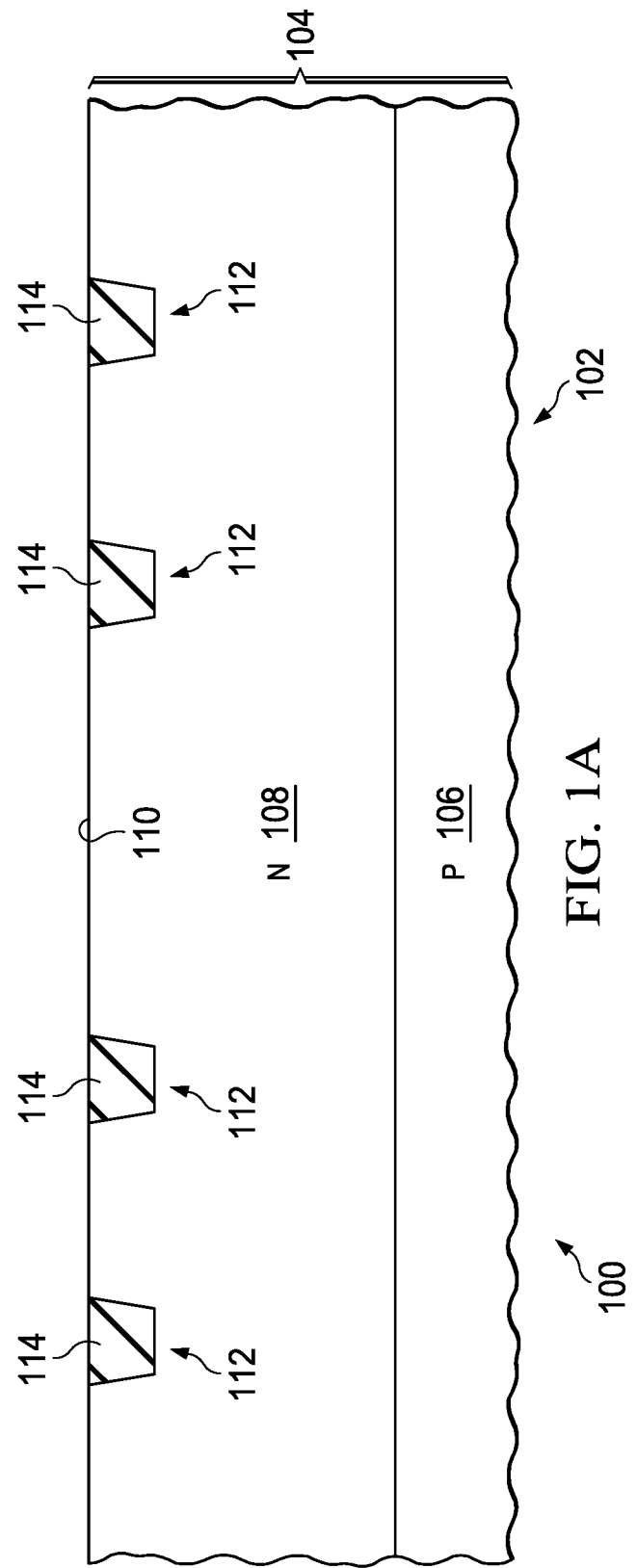
FIG. 1A through FIG. 1E are cross sections of an example microelectronic device that includes a Hall sensor, depicting stages of an example method of forming the microelectronic device.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

In addition, although some of the embodiments illustrated herein are shown in two dimensional views with various regions having depth and width, it should be clearly understood that these regions are illustrations of only a portion of a device that is actually a three dimensional structure. Accordingly, these regions will have three dimensions, including length, width, and depth, when fabricated on an actual device. Moreover, while the present invention is illustrated by embodiments directed to active devices, it is not intended that these illustrations be a limitation on the scope or applicability of the present invention. It is not intended that the active devices of the present invention be limited to the physical structures illustrated. These structures are included to demonstrate the utility and application of the present invention to presently preferred embodiments.

A microelectronic device includes a Hall sensor. The microelectronic device is formed in and on a substrate having a semiconductor material. A Hall plate of the Hall sensor is formed in the semiconductor material. The Hall sensor includes a contact region in the semiconductor material, contacting the Hall plate, having a same conductivity type as the Hall plate. The contact region has a greater average dopant concentration than the Hall plate. The Hall sensor includes an isolation structure including dielectric material contacting the semiconductor material, located on two opposite sides of the contact region. The isolation structure may extend deeper into the substrate than the contact region. The contact region is separated from the isolation structure by a gap. The Hall sensor includes a conductive spacer over the gap, the conductive spacer being separated from the semiconductor material by an insulating layer. Having the isolation structure located on two opposite sides of the contact region may advantageously improve a magnetic gain of the Hall sensor, by displacing current through the Hall plate deeper in the substrate where a dopant concentration is lower, which increases a Hall sensitivity of the Hall sensor. Having the contact region separated from the isolation structure may advantageously improve a noise level of the Hall sensor, by reducing carrier trapping of charges by the dielectric material in the isolation structure. Having the conductive spacer over the gap may advantageously further improve the noise level by separating the semiconductor material adjacent to the contact region from charge trapping dielectric materials in an interconnect region over the substrate, and by providing a conductive blocking layer between trapped charge in the interconnect region and the Hall plate. The conductive spacer may extend over at least a portion of the isolation structure, which may further reduce charge trapping in the isolation structure due to trapped charge in the interconnect region by separating the trapped charge from the isolation structure and by providing a conductive blocking layer between the trapped charge and the isolation structure. The Hall sensor further includes a screen structure between the Hall plate and a top surface of the substrate; the screen structure includes semiconductor material having an opposite conductivity type from the Hall plate. At least a portion of the screen structure is laterally separated from the contact region by the isolation structure. The screen structure may also improve the noise level by reducing charge trapping of carriers from the Hall plate in dielectric material contacting the top surface of the substrate.

It is noted that terms such as top, over, above, and under may be used in this disclosure. These terms should not be construed as limiting the position or orientation of a structure or element, but should be used to provide spatial relationship between structures or elements. For the purposes of this disclosure, the terms "laterally" refers to a direction parallel to a plane of the top surface of the substrate. The term "vertical" is understood to refer to a direction perpendicular to the plane of the top surface of the substrate.

FIG. 1A through FIG. 1E are cross sections of an example microelectronic device 100 that includes a Hall sensor 102, depicting stages of an example method of forming the microelectronic device 100. Referring to FIG. 1A, the microelectronic device 100 may be manifested as an integrated circuit, a discrete semiconductor device, a microelectrical mechanical system (MEMS) device, an electro-optical device, or a microfluidic device, by way of example. The microelectronic device 100 is formed in and on a substrate 104. The substrate includes a semiconductor material 106. The substrate 104 may be implemented, for example, as part of a semiconductor wafer, part of a silicon-on-insulator (SOI) wafer, or other structure suitable for forming the microelectronic device 100. The substrate 104 may include other microelectronic devices, not shown, that are fabricated concurrently with the microelectronic device 100. The semiconductor material 106 may include primarily silicon, with dopant elements. Alternatively, the semiconductor material 106 may include silicon and carbon, or silicon and germanium. Other elements in the semiconductor material 106 are within the scope of this example. In this example, the semiconductor material 106 may be p-type, as indicated in FIG. 1A.

The Hall sensor 102 includes a Hall plate 108 in the semiconductor material 106. The Hall plate 108 has a first conductivity type; in this example, the Hall plate 108 may be n-type, as indicated in FIG. 1A. The Hall plate 108 extends to a top surface 110 of the substrate 104.

An isolation structure 112 of the Hall sensor 102 is formed in the substrate 104, extending to the top surface 110. The isolation structure 112 includes a dielectric material 114. In this example, the isolation structure 112 may be implemented as a shallow trench isolation (STI) structure, and the dielectric material 114 may be implemented as silicon dioxide. The isolation structure 112 of this example may be formed by etching isolation trenches in the substrate 104, and forming a liner of silicon dioxide by a thermal oxidation process. A fill layer of silicon dioxide is formed on the liner by a chemical vapor deposition (CVD) process, filling the isolation trenches. Excess silicon dioxide is removed from above the top surface 110 by an etchback process, a chemical mechanical planarization (CMP) process. The isolation structure 112 be formed concurrently with a field relief oxide layer for other components, not shown in the microelectronic device 100.

Figure 1B:
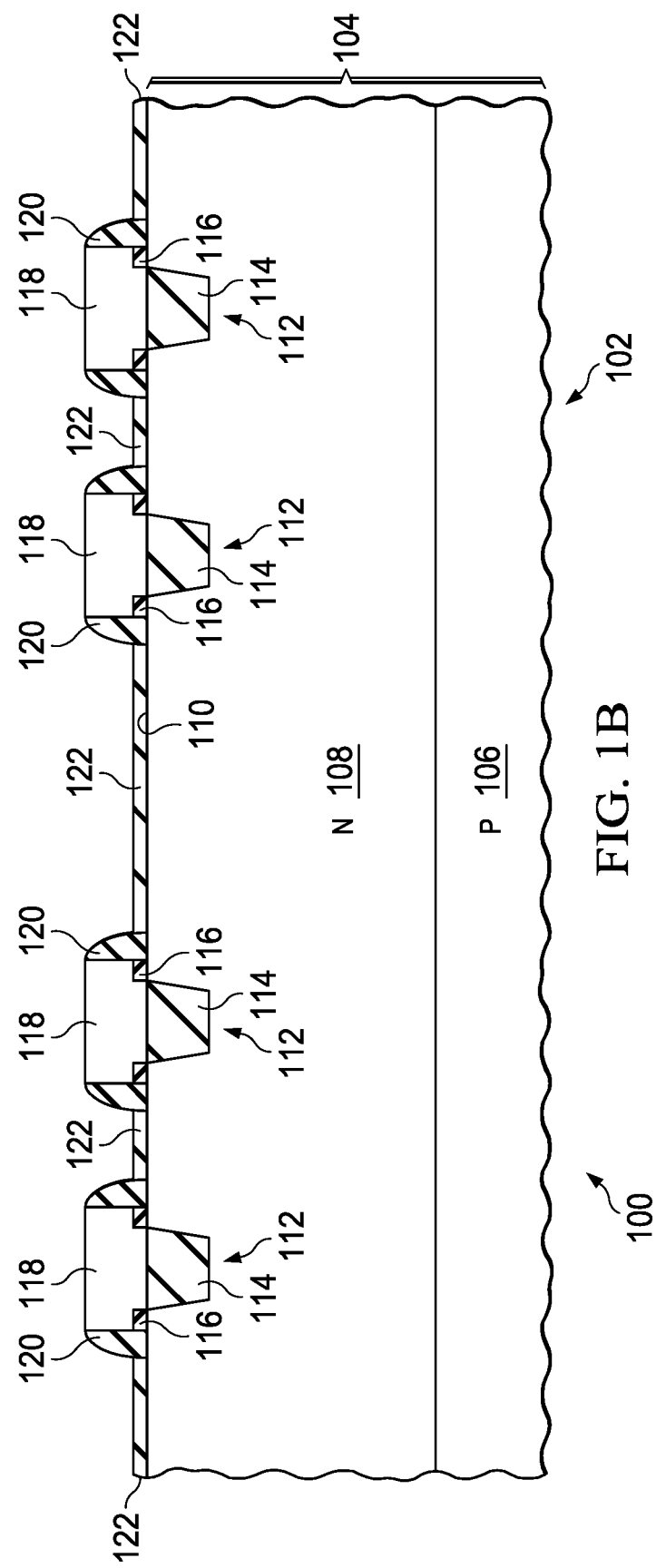

Referring to FIG. 1B, an insulating layer 116 of the Hall sensor 102 is formed on the substrate 104 at the top surface 110. The insulating layer 116 may include silicon dioxide, nitridated silicon dioxide, hafnium oxide, zirconium oxide, aluminum oxide, tantalum pentoxide, or a combination thereof, by way of example. Silicon dioxide in the insulating layer 116 may be formed by a thermal oxidation process. Hafnium oxide, zirconium oxide, and tantalum pentoxide in the insulating layer 116 may be formed by a metal organic chemical vapor deposition (MOCVD) process. Aluminum oxide in the insulating layer 116 may be formed by an atomic layer deposition (ALD) process. The insulating layer 116 may be formed concurrently with gate dielectric layers of metal oxide semiconductor (MOS) transistors, not shown, in the microelectronic device 100, advantageously reducing fabrication cost and complexity.

Conductive spacers 118 of the Hall sensor 102 are formed on the insulating layer 116. In this example, the conductive spacers 118 may overlap the isolation structure 112, as depicted in FIG. 1B. The conductive spacers 118 are electrically conductive, and may include polycrystalline silicon, commonly referred to as polysilicon, titanium nitride, or metal silicide, by way of example. Polysilicon and titanium nitride in the conductive spacers 118 may be formed by forming a layer of spacer material, not shown, on the insulating layer 116 and the isolation structure 112, forming an etch mask over the layer of spacer material, and removing the spacer material where exposed by the etch mask. Metal silicide in the conductive spacers 118 may be formed by forming a polysilicon plug laterally surrounded by silicon dioxide or silicon nitride, and reacting the polysilicon with a refractory metal, such as titanium or cobalt. The conductive spacers 118 may be formed concurrently with gates of the MOS transistors, not shown, in the microelectronic device 100, further reducing fabrication cost and complexity.

Sidewalls 120 may optionally be formed on sides of the conductive spacers 118. The sidewalls 120 may include one or more layers of silicon dioxide or silicon nitride, by way of example. The sidewalls 120 may be formed by forming conformal layers, not shown, of the silicon dioxide or silicon nitride over the conductive spacers 118 and the top surface 110 of the substrate 104, by low pressure chemical vapor deposition (LPCVD) processes or plasma enhanced chemical vapor deposition (PECVD) processes, using tetraethyl orthosilicate (TEOS), formally named tetraethoxysilane, or bis(tertiary-butyl-amino)silane (BTBAS). The silicon dioxide or silicon nitride is subsequently removed from over top surfaces of the conductive spacers 118 and the top surface 110 of the substrate 104 by an anisotropic etch process, such as a reactive ion etch (RIE) process using fluorine radicals.

A protective layer 122 of silicon dioxide may be formed on exposed silicon at the top surface 110 of the substrate 104, to protect the semiconductor material 106 during subsequent fabrication operations. The protective layer 122 may be formed by a thermal oxidation process, and may be 5 nanometers to 15 nanometers thick, for example.

Figure 1C:
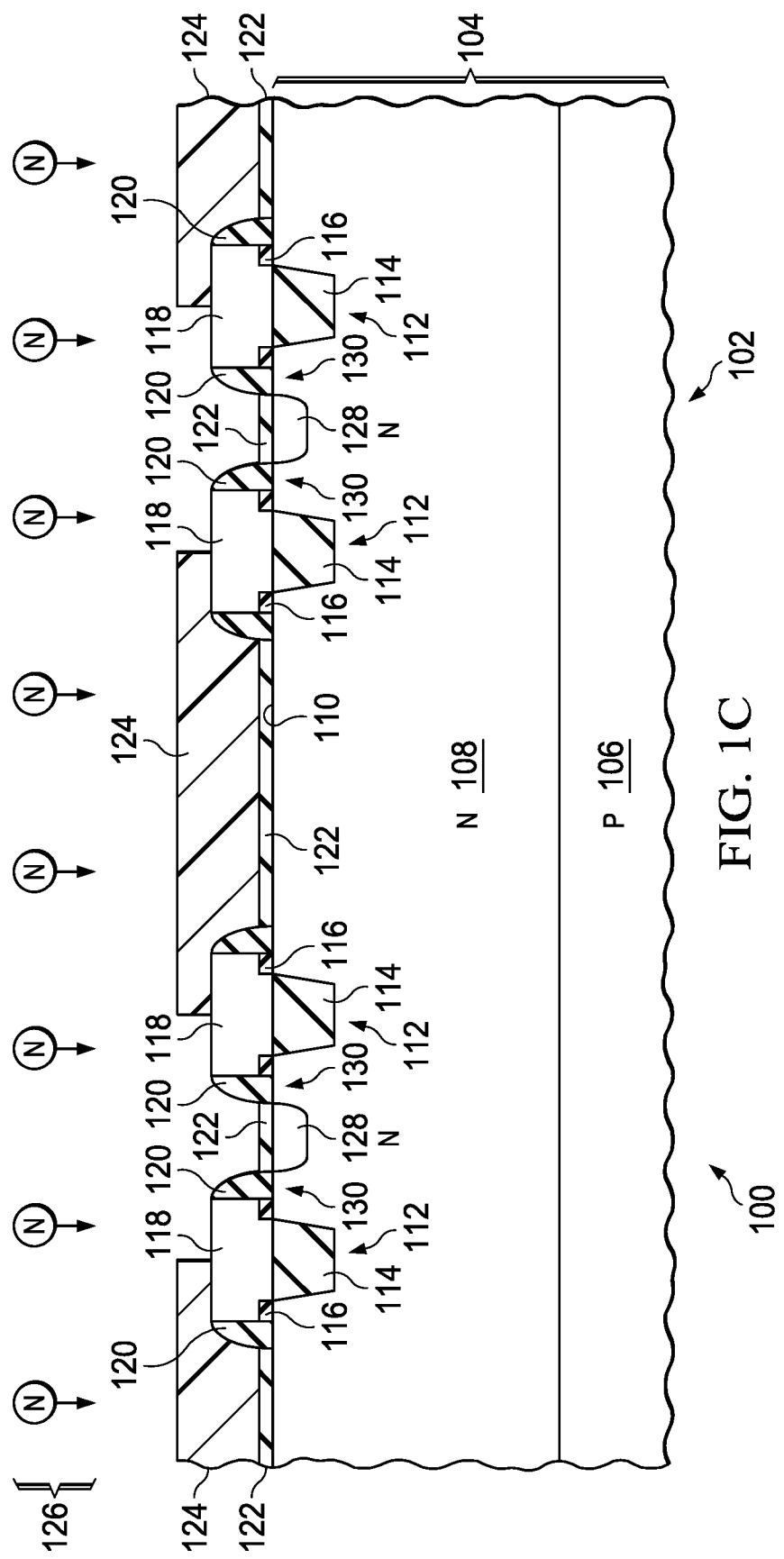

Referring to FIG. 1C, a contact implant mask 124 is formed over the microelectronic device 100, exposing areas between adjacent instances of the conductive spacers 118. The contact implant mask 124 may include photoresist, and may be formed by a photolithographic process.

N-type dopants 126, such as phosphorus, arsenic, or antimony, are implanted into the Hall plate 108 where exposed by a combination of the contact implant mask 124, the conductive spacers 118, and the sidewalls 120. The n-type dopants 126 may be implanted at a total dose of $1 \times 10^{14}$ ions/cm$^2$ to $1 \times 10^{16}$ ions/cm$^2$, by way of example. The n-type dopants 126 may be implanted concurrently into source and drain regions of n-channel MOS transistors, not shown, in the microelectronic device 100, advantageously reducing fabrication cost and complexity.

After the n-type dopants 126 are implanted, the contact implant mask 124 is removed. The contact implant mask 124 may be removed by a combination of an oxygen plasma process, such as an asher process, and a wet clean process using an aqueous mixture of sulfuric acid and hydrogen peroxide. Other processes for removing the contact implant mask 124 are within the scope of this example.

After the contact implant mask 124 is removed, the substrate 104 is heated to activate the implanted n-type dopants 126 to form contact regions 128 of the Hall sensor 102 in the semiconductor material 106, between the adjacent instances of the conductive spacers 118. The substrate 104 may be heated in a rapid thermal anneal, a spike anneal, or a flash anneal, by way of example. A rapid thermal anneal may heat the substrate 104 to 1000° C. to 1150° C. for 5 seconds to 60 seconds, and may be implemented in a rapid thermal processor using an incandescent lamp. A spike anneal may heat the substrate 104 to 1100° C. to 1250° C. for 100 milliseconds seconds to 5 seconds, and may be implemented by an arc flash lamp. A flash anneal may heat the substrate 104 to 1200° C. to 1350° C. for 50 microseconds to 1 millisecond, and may be implemented by a flash lamp or a scanned laser. The contact regions 128 make direct contact to the Hall plate 108. Each contact region 128 has the isolation structure 112 on two opposite sides, and is separated from the isolation structure 112 by a gap 130. Each contact region 128 may be wider than the immediately adjacent gap 130, which may advantageously improve a magnetic gain of the Hall sensor 102. The isolation structure 112 may extend deeper into the substrate 104 than the contact regions 128, which may further improve the magnetic gain. The contact regions 128 have a higher average dopant concentration than the Hall plate 108. By way of example, the average dopant concentration of the contact regions 128 may be 10 to 100 times the average dopant concentration of the Hall plate 108, which may advantageously provide a low resistance connection to the Hall plate 108.

Figure 1D:
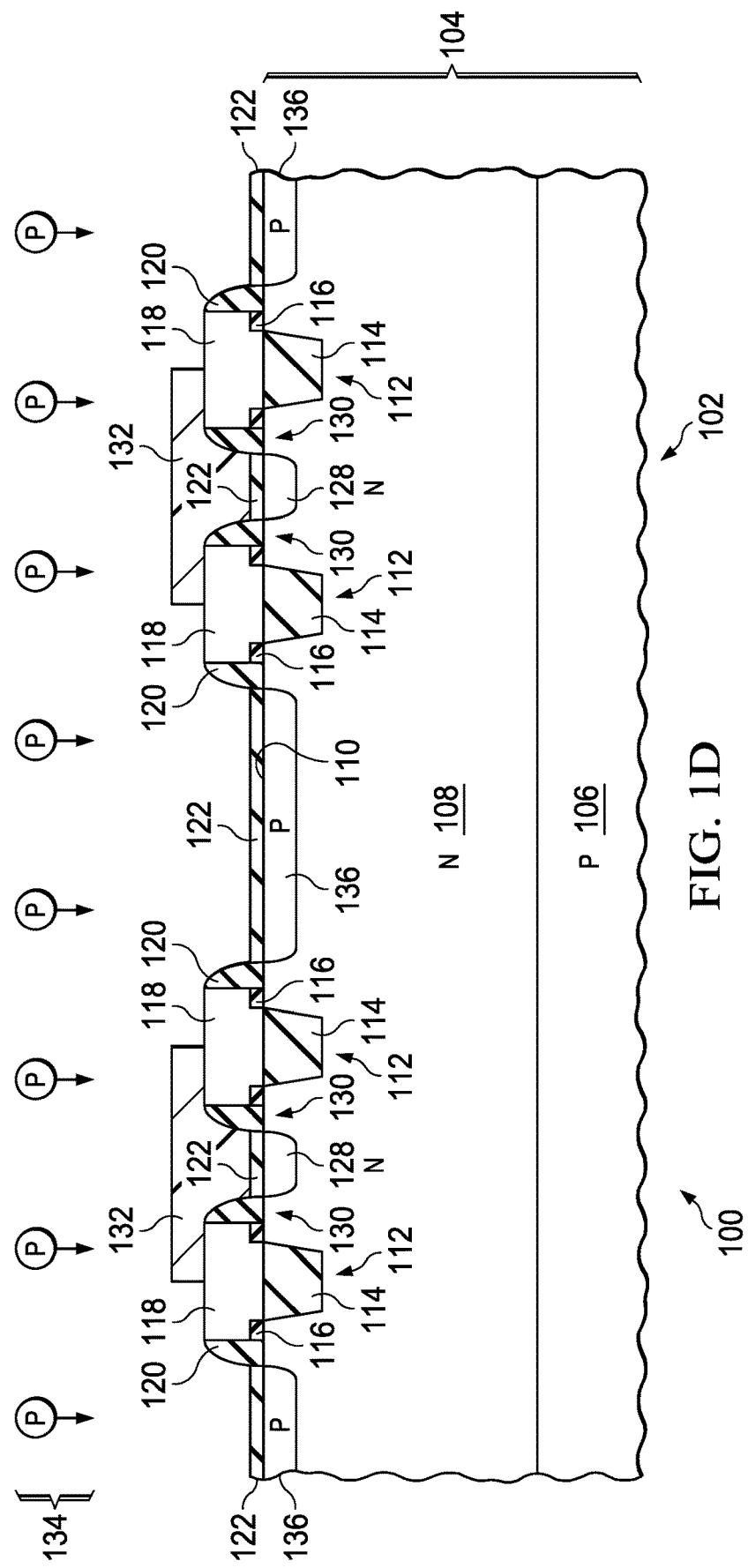

Referring to FIG. 1D, a screen implant mask 132 is formed over the microelectronic device 100, covering the contact regions 128 and the gaps 130 adjacent to the contact regions 128, and exposing the Hall plate 108 in areas between instances of the isolation structures 112 that are free of the contact regions 128 and the gaps 130. The screen implant mask 132 may have a composition similar to the contact implant mask 124 of FIG. 1C, and may be formed by a similar process.

P-type dopants 134, such as boron, gallium, and indium, are implanted into the Hall plate 108 where exposed by a combination of the screen implant mask 132, the conductive spacers 118, and the sidewalls 120. The p-type dopants 134 may be implanted at a total dose of $1 \times 10^{14}$ ions/cm$^2$ to $1 \times 10^{16}$ ions/cm$^2$, by way of example. The p-type dopants 134 may be implanted concurrently into source and drain regions of p-channel MOS transistors, not shown, in the microelectronic device 100, further reducing fabrication cost and complexity.

After the p-type dopants 134 are implanted, the screen implant mask 132 is removed. The screen implant mask 132 may be removed by a process similar to that used to remove the contact implant mask 124 of FIG. 1C.

After the screen implant mask 132 is removed, the substrate 104 is heated to activate the implanted p-type dopants 134 to form a screen structure 136 of the Hall sensor 102 in the semiconductor material 106, between the Hall plate 108 and the top surface_110 of the substrate 104. The screen structure 136 has an opposite conductivity type from the Hall plate 108. The screen structure 136 may be separated from the isolation structure 112, as depicted in FIG. 1D, or may contact the isolation structure 112.

Figure 1E:
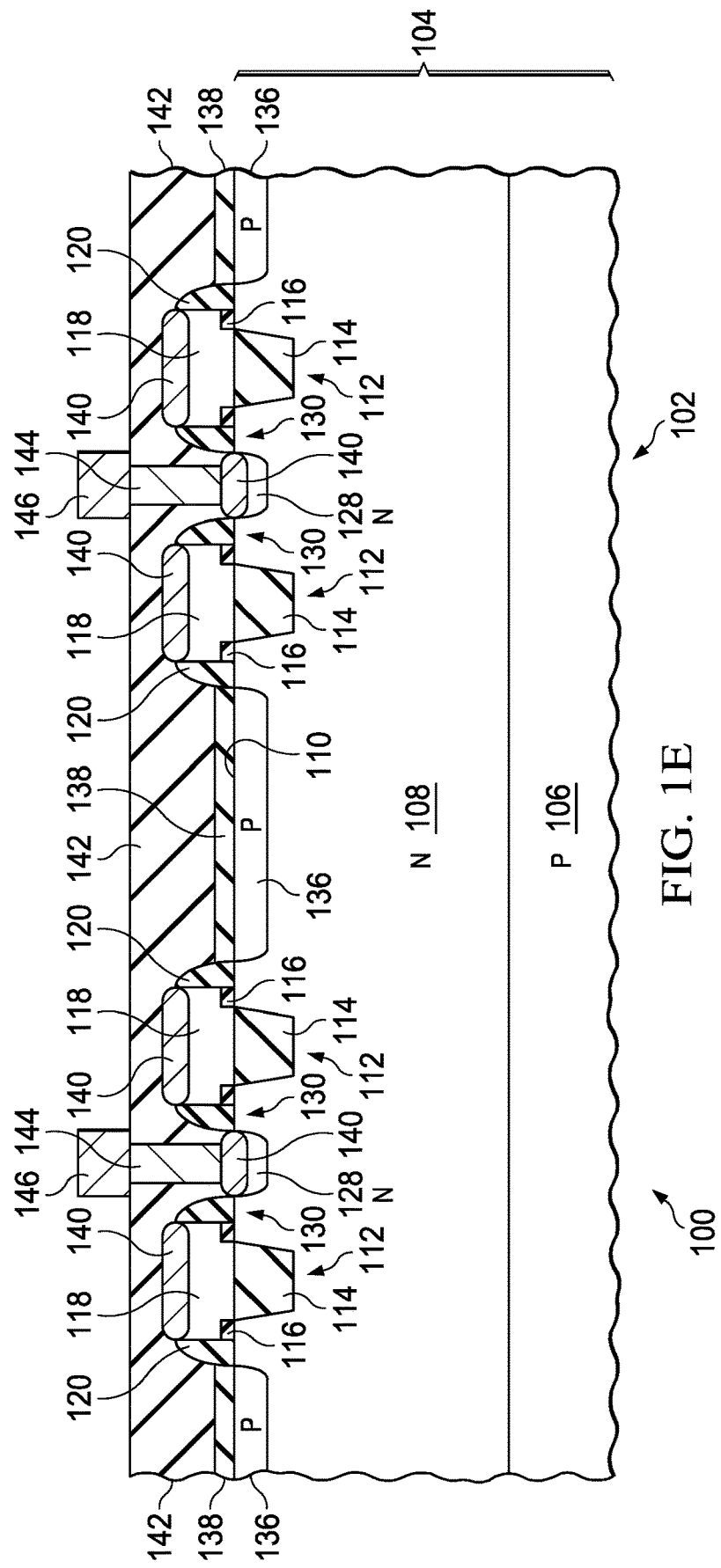

Referring to FIG. 1E, an optional silicide blocking layer 138 may be formed over the top surface 110 above the screen structure 136. The silicide blocking layer 138 may include silicon dioxide or silicon nitride, for example. Metal silicide 140 may subsequently be formed on exposed silicon on the contact regions 128 at the top surface 110, and on the polysilicon in the conductive spacers 118, if present. The metal silicide 140 may include titanium silicide, cobalt silicide, or nickel silicide, by way of example. The metal silicide 140 may be formed by forming a layer of metal on the microelectronic device 100, contacting the exposed silicon. Subsequently, the microelectronic device 100 is heated to react the layer of metal with the exposed silicon to form the metal silicide 140. Unreacted metal is removed from the silicide blocking layer 138, leaving the metal silicide 140 in place. The unreacted metal may be removed by a wet etch process using an aqueous mixture of sulfuric acid and hydrogen peroxide, or an aqueous mixture of nitric acid and hydrochloric acid, by way of example. The metal silicide 140 may provide low resistance connections to the contact regions 128 and the conductive spacers 118, compared to a similar microelectronic device without metal silicide.

A pre-metal dielectric (PMD) layer 142 is formed over the microelectronic device 100. The PMD layer 142 is electrically non-conductive, and includes one or more sublayers of dielectric material. By way of example, the PMD layer 142 may include a PMD liner, not shown, of silicon nitride, formed by a LPCVD process or a PECVD process, contacting the metal silicide 140 and the silicide blocking layer 138. The PMD layer 142 may also include a planarized layer, not shown, of silicon dioxide, phosphosilicate glass (PSG), fluorinated silicate glass (FSG), or borophosphosilicate glass (BPSG), formed by a PECVD process using TEOS, a high density plasma (HDP) process, or a high aspect ratio process (HARP) using TEOS and ozone, on the PMD liner. The PMD layer 142 may further include a PMD cap layer, not shown, of silicon nitride, silicon carbide, or silicon carbonitride, suitable for an etch-stop layer or a CMP stop layer, formed by a PECVD process on the planarized layer. Other layer structures and compositions for the PMD layer 142 are within the scope of this example. One or more of the sublayers of dielectric material in the PMD layer 142 may trap charge during operation of the Hall sensor 102, undesirably degrading the noise level and the offset. Having the conductive spacers 118 and the screen structure 136 between the Hall plate 108 and the PMD layer 142 may advantageously separate the trapped charge from the Hall plate 108 and provide a conductive blocking layer between the trapped charge and the Hall plate 108.

Contacts 144 are formed through the PMD layer 142, making electrical connections to the metal silicide 140 on the conductive spacers 118 and the contact regions 128. The contacts 144 are electrically conductive, and may include an adhesion layer, not shown, of titanium contacting the PMD layer 142 and the metal silicide 140, a contact liner, not shown, of titanium nitride on the adhesion layer, and a tungsten core, not shown, on the contact liner. The contacts 144 may be formed by etching contact holes through the PMD layer 142 to expose the metal silicide 140. The contact liner may be formed by sputtering titanium followed by forming titanium nitride using an ALD process or a reactive sputtering process. The tungsten core may be formed by an MOCVD process using tungsten hexafluoride reduced by silane initially, and by hydrogen after a layer of tungsten is formed on the contact liner. The tungsten, titanium nitride, and titanium are subsequently removed from a top surface of the PMD layer 142 by an etch process, a tungsten CMP process, or a combination of both, leaving the contacts 144 extending to the top surface of the PMD layer 142. Other structures and compositions for the contacts 144 are within the scope of this example.

Interconnects 146 are formed on the PMD layer 142, making electrical connections to the contacts 144. The interconnects 146 are electrically conductive. In one version of this example, the interconnects 146 may have an etched aluminum structure, and may include an adhesion layer, not shown, of titanium nitride or titanium tungsten, on the PMD layer 142, an aluminum layer, not shown, with a few atomic percent of silicon, titanium, or copper, on the adhesion layer, and a barrier layer, not shown, of titanium nitride on the aluminum layer. The etched aluminum interconnects may be formed by depositing the adhesion layer, the aluminum layer, and the barrier layer, and forming an etch mask, not shown, followed by an RIE process to etch the anti-reflection layer, the aluminum layer, and the adhesion layer where exposed by the etch mask, and subsequently removing the etch mask. In another version of this example, the interconnects 146 may have a damascene structure, and may include a barrier liner of tantalum and tantalum nitride in an interconnect trench in an intra-metal dielectric (IMD) layer, not shown, on the PMD layer 142, with a copper fill metal in the interconnect trench on the barrier liner. The damascene interconnects may be formed by depositing the IMD layer on the PMD layer 142, and etching the interconnect trenches through the IMD layer to expose the contacts 144. The barrier liner may be formed by sputtering tantalum onto the IMD layer and exposed PMD layer 142 and contacts 144, and forming tantalum nitride on the sputtered tantalum by an ALD process. The copper fill metal may be formed by sputtering a seed layer, not shown, of copper on the barrier liner, and electroplating copper on the seed layer to fill the interconnect trenches. Copper and barrier liner metal is subsequently removed from a top surface of the IMD layer by a copper CMP process. In a further version of this example, the interconnects 146 may have a plated structure, and may include an adhesion layer, not shown, on the PMD layer 142 and the contacts 144, with copper interconnects on the adhesion layer. The plated interconnects may be formed by sputtering the adhesion layer, containing titanium, on the PMD layer 142 and contacts 144, followed by sputtering a seed layer, not shown, of copper on the adhesion layer. A plating mask is formed on the seed layer that exposes areas for the interconnects 146. The copper interconnects are formed by electroplating copper on the seed layer where exposed by the plating mask. The plating mask is removed, and the seed layer and the adhesion layer are removed by wet etching between the interconnects. Other methods of forming the interconnects 146 are within the scope of this example. The interconnects 146 are electrically connected to the Hall plate 108 through the contacts 144, the metal silicide 140, and the contact regions 128.

Figure 2A:
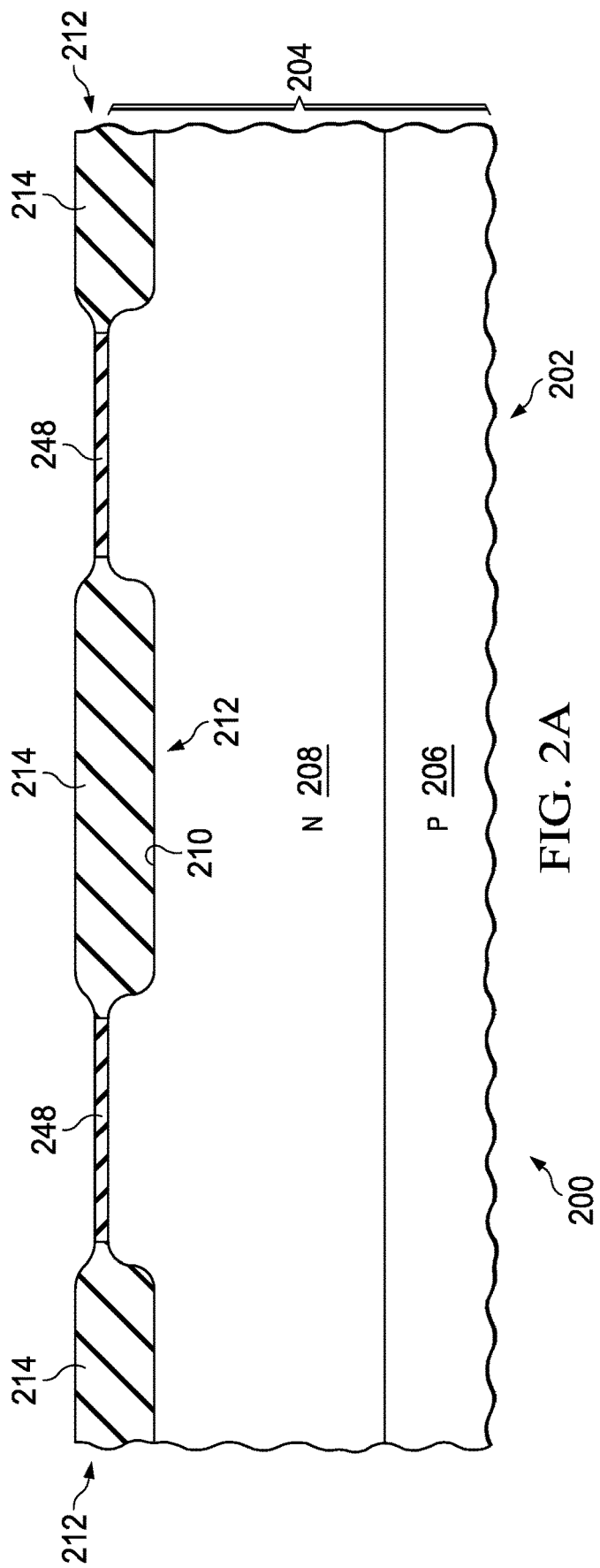
FIG. 2A through FIG. 2F are cross sections of another example microelectronic device that includes a Hall sensor, depicting stages of an example method of forming the microelectronic device.

FIG. 2A through FIG. 2F are cross sections of another example microelectronic device 200 that includes a Hall sensor 202, depicting stages of an example method of forming the microelectronic device 200. Referring to FIG. 2A, the microelectronic device 200 is formed in and on a substrate 204 that includes a semiconductor material 206. The microelectronic device 200 and the substrate 204 may be manifested as any of the examples disclosed in reference to the microelectronic device 100 and the substrate 104 of FIG. 1A. The semiconductor material 206 may include primarily silicon, with dopant elements. In this example, the semiconductor material 206 may be p-type, as indicated in FIG. 2A.

The Hall sensor 202 includes a Hall plate 208 in the semiconductor material 206. The Hall plate 208 has a first conductivity type; in this example, the Hall plate 208 may be n-type, as indicated in FIG. 2A. The Hall plate 208 extends to a top surface 210 of the substrate 204.

An isolation structure 212 of the Hall sensor 202 is formed in the substrate 204, extending to the top surface 210. The isolation structure 212 includes a dielectric material 214. In this example, the isolation structure 212 may be implemented as a local oxidation of silicon (LOCOS) structure, and the dielectric material 214 may be implemented as silicon dioxide. The isolation structure 212 of this example may be formed by forming a layer of thermal oxide 248 at the top surface 210, and forming a patterned layer of silicon nitride, not shown on the thermal oxide 248. The isolation structure 212 is formed by thermal oxidation in areas exposed by the patterned layer of silicon nitride. The patterned layer of silicon nitride is subsequently removed. The isolation structure 212 formed by the LOCOS process has tapered edges, as depicted in FIG. 2A, commonly referred to as "bird's beaks". In this example, the layer of thermal oxide 248 remains over the top surface 210 adjacent to the isolation structure 212. The isolation structure 212 may be formed concurrently with a field relief oxide layer for other components, not shown in the microelectronic device 200.

Figure 2B:
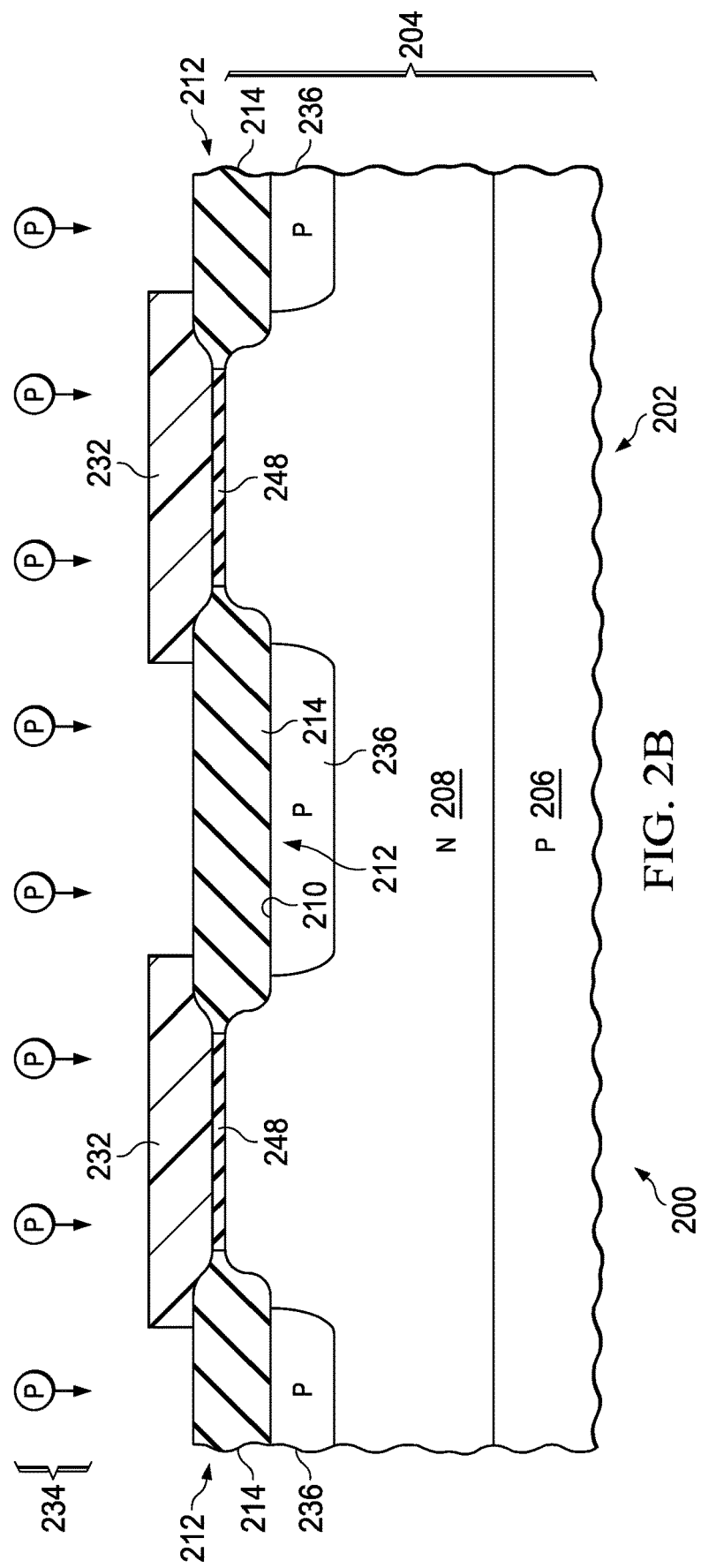

Referring to FIG. 2B, a screen implant mask 232 is formed over the microelectronic device 200, exposing areas above the Hall plate 208 for a screen structure 236 of the Hall sensor 202. The screen implant mask 232 may include photoresist, and may be formed by a photolithographic process. The screen implant mask 232 is sufficiently thick to block p-type dopants 234 that are implanted with enough energy to pass through the isolation structure 212 into the Hall plate 208. The p-type dopants 234 of this example include primarily boron. The p-type dopants 234 are implanted into the Hall plate 208 where exposed by the screen implant mask 232. The p-type dopants 234 may be implanted at a total dose of $1\times10^{12}$ ions/cm$^2$ to $1\times10^{14}$ ions/cm$^2$, by way of example. The p-type dopants 234 may be implanted concurrently into well regions under n-channel MOS transistors, not shown, in the microelectronic device 200, advantageously reducing fabrication cost and complexity.

After the p-type dopants 234 are implanted, the screen implant mask 232 is removed. The screen implant mask 232 may be removed as disclosed in reference to removal of the contact implant mask 124 of FIG. 1C.

After the screen implant mask 232 is removed, the substrate 204 is heated to activate the implanted p-type dopants 234 to form the screen structure 236 in the semiconductor material 206, between the Hall plate 208 and the top surface 210 of the substrate 204. The substrate 204 may be heated in furnace anneal, or a rapid thermal anneal, by way of example. A furnace thermal anneal may heat the substrate 204 to 850° C. to 1000° C. for 10 minutes to 2 hours, and may be implemented in a tube furnace with a nitrogen ambient.

Figure 2C:
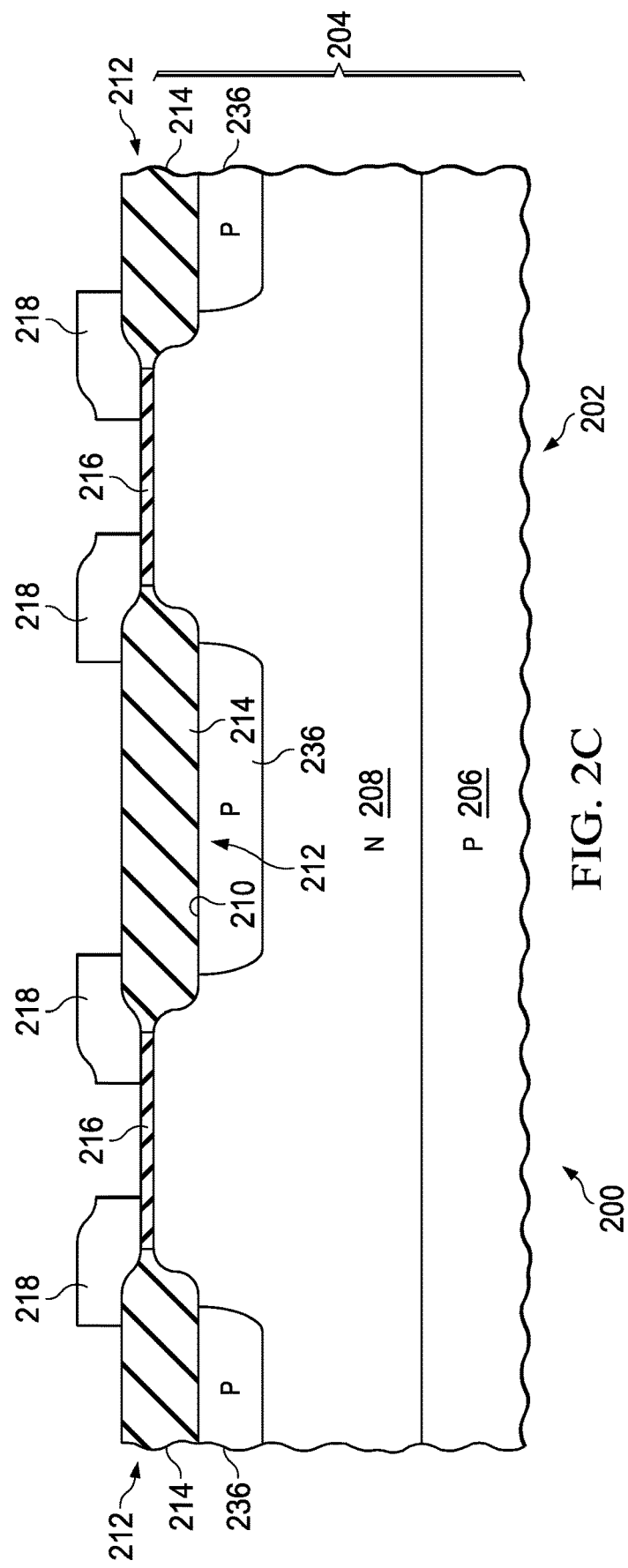

Referring to FIG. 2C, the layer of thermal oxide 248 of FIG. 2B is removed, and an insulating layer 216 is formed on the substrate 204 at the top surface 210 between adjacent instances of the isolation structure 212. The layer of thermal oxide 248 may be removed by a wet etch process using a dilute aqueous solution of buffered hydrofluoric acid, for example. The insulating layer 216 may have a composition as disclosed in reference to the insulating layer 116 of FIG. 1B, and may be formed by the corresponding processes disclosed for the insulating layer 116. The insulating layer 216 may be formed concurrently with gate dielectric layers of MOS transistors, not shown, in the microelectronic device 200, advantageously reducing fabrication cost and complexity.

Conductive spacers 218 of the Hall sensor 202 are formed on the isolation structure 212, extending partially onto the insulating layer 216. The conductive spacers 218 may partially extend above the screen structure 236, as depicted in FIG. 2C. The conductive spacers 218 are electrically conductive. The conductive spacers 218 may have any of the compositions disclosed in reference to the conductive spacers 118 of FIG. 1B, and may be formed as disclosed in reference to the conductive spacers 118. The conductive spacers 218 may be formed concurrently with gates of the MOS transistors, not shown, in the microelectronic device 200, further reducing fabrication cost and complexity.

Figure 2D:
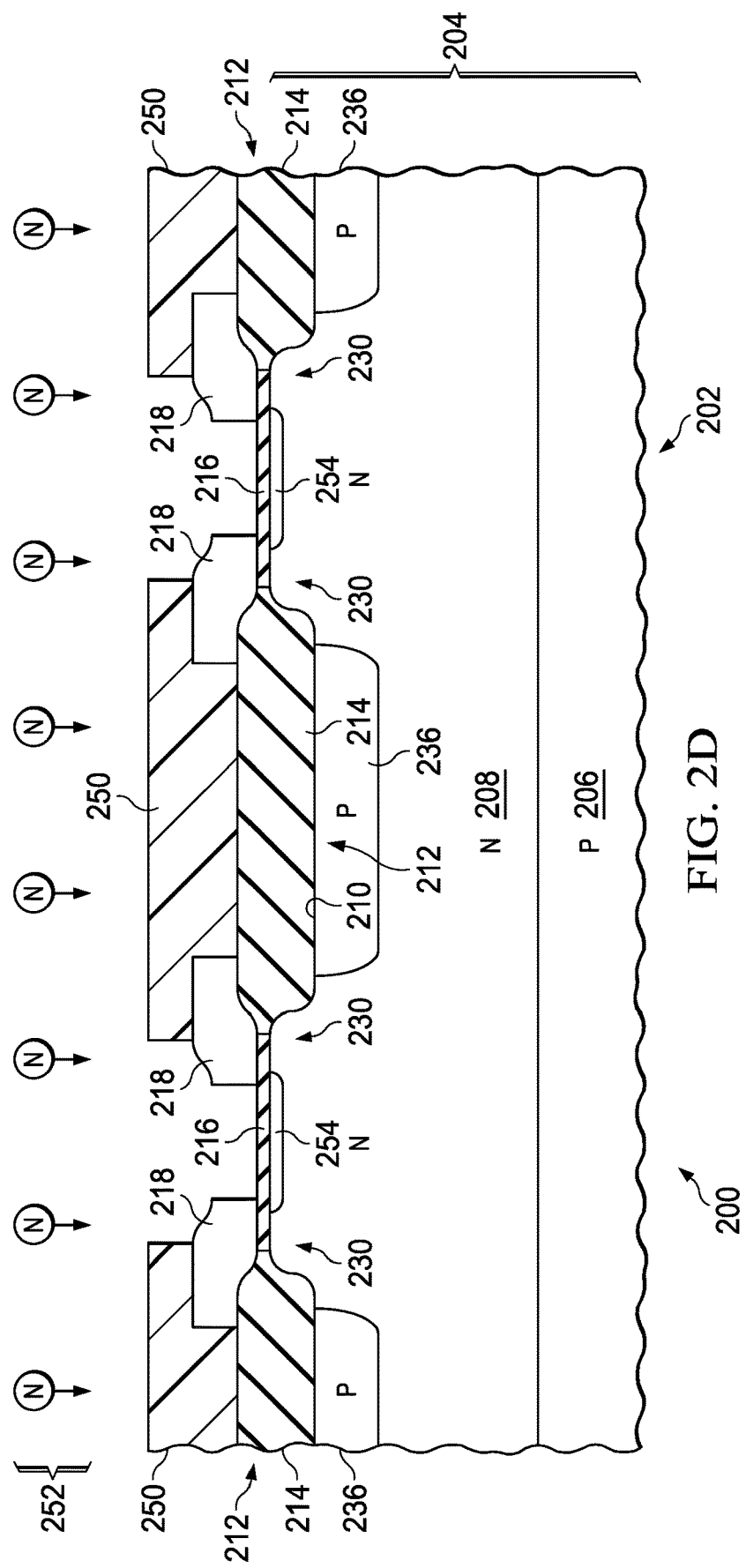

Referring to FIG. 2D, a lightly doped drain (LDD) implant mask 250 is formed over the microelectronic device 200, exposing the insulating layer 216 between adjacent portions of the isolation structure 212. The LDD implant mask 250 may overlap partially onto the conductive spacers 218 adjacent to the exposed insulating layer 216, as depicted in FIG. 2D. The LDD implant mask 250 may include photoresist and may be formed by a photolithographic process.

First n-type dopants 252 such as phosphorus, arsenic, or antimony, are implanted into the Hall plate 208 where exposed by a combination of the LDD implant mask 250 and the conductive spacers 218. The first n-type dopants 252 may be implanted at a total dose of $1 \times 10^{13}$ ions/cm$^2$ to $1 \times 10^{15}$ ions/cm$^2$, by way of example. The first n-type dopants 252 may be implanted concurrently into LDD regions of the n-channel MOS transistors, not shown, in the microelectronic device 200, advantageously reducing fabrication cost and complexity.

After the first n-type dopants 252 are implanted, the LDD implant mask 250 is removed. The LDD implant mask 250 may be removed as disclosed for the removing the contact implant mask 124 of FIG. 1C.

After the LDD implant mask 250 is removed, the substrate 204 is heated to activate the implanted first n-type dopants 252 to form contact extension regions 254 in the semiconductor material 206, between adjacent instances of the conductive spacers 218. The substrate 204 may be heated in a rapid thermal anneal, a spike anneal, or a flash anneal, by way of example. The contact extension regions 254 make direct contact to the Hall plate 208. Each contact extension region 254 has the isolation structure 212 on two opposite sides, and is separated from the isolation structure 212 by a gap 230 on the two opposite sides. The contact extension regions 254 have a higher average dopant concentration than the Hall plate 208, which may advantageously provide a low resistance connection to the Hall plate 208.

Figure 2E:
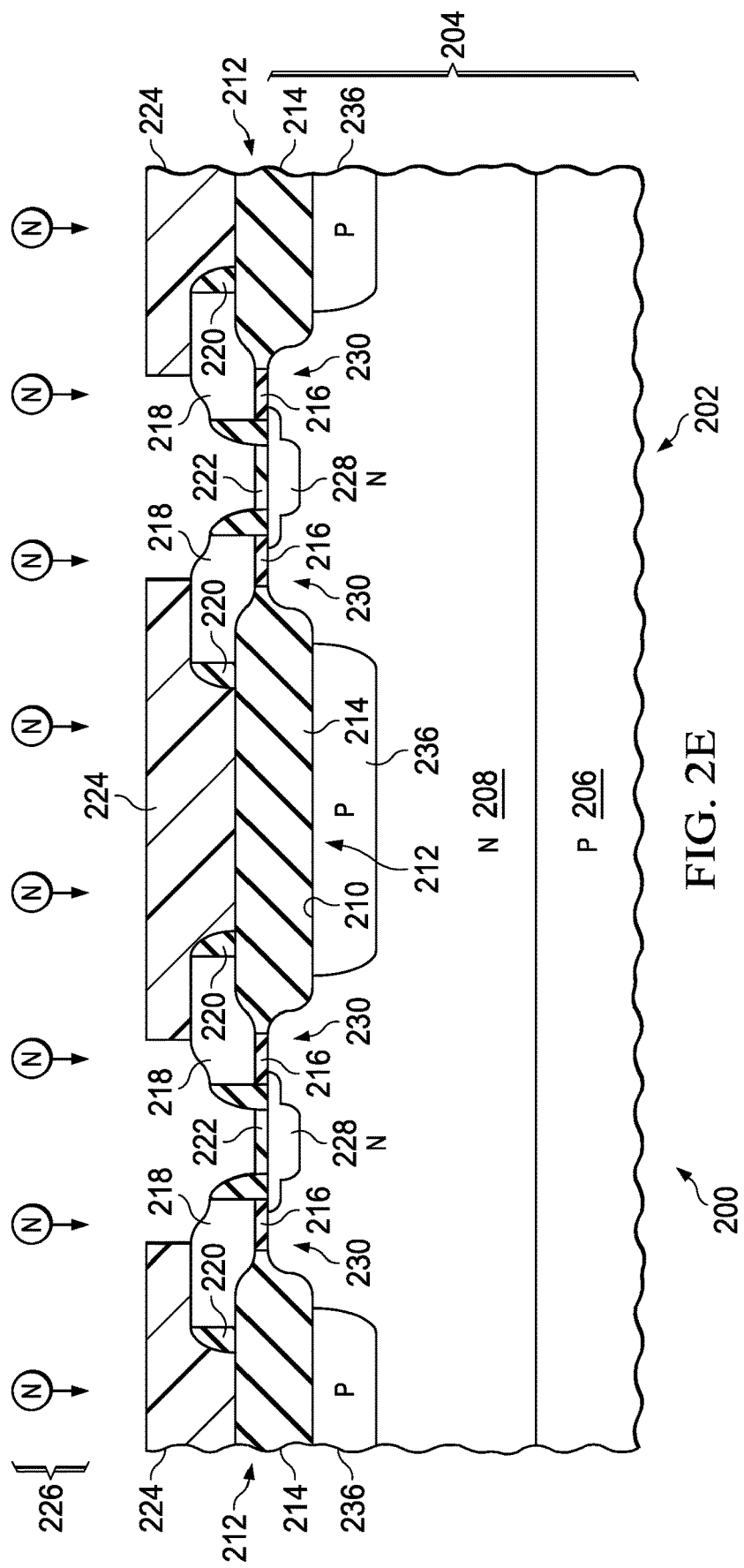

Referring to FIG. 2E, sidewalls 220 may optionally be formed on sides of the conductive spacers 218. The sidewalls 220 may have a composition and layer structure similar to the sidewalls 120 of FIG. 1B, and may be formed by processes disclosed in reference to the sidewalls 120. A protective layer 222 of silicon dioxide may be formed on exposed silicon at the top surface 210 of the substrate 204, to protect the semiconductor material 206 during subsequent fabrication operations.

A contact implant mask 224 is formed over the microelectronic device 200, exposing areas between adjacent instances of the conductive spacers 218. The contact implant mask 224 may include photoresist, and may be formed by a photolithographic process. Second n-type dopants 226 are implanted into the Hall plate 208 where exposed by a combination of the contact implant mask 224, the conductive spacers 218, and the sidewalls 220, as disclosed in reference to the n-type dopants 126 of FIG. 1C. After the second n-type dopants 226 are implanted, the contact implant mask 224 is removed. The substrate 204 is subsequently heated to activate the implanted second n-type dopants 226. The substrate 204 may be heated in a rapid thermal anneal, a spike anneal, or a flash anneal, by way of example. A combination of the activated second n-type dopants 226 and the contact extension regions 254 of FIG. 2D form contact regions 228 of the Hall sensor 202 in the semiconductor material 206, between the adjacent instances of the conductive spacers 218.

The contact regions 228 make direct contact to the Hall plate 208. Each contact region 228 has the isolation structure 212 on two opposite sides, and is separated from the isolation structure 212 by the gap 230. Each contact region 228 may be wider than the immediately adjacent gap 230, the isolation structure 212 may extend deeper into the substrate 204 than the contact regions 228, and the contact regions 228 have a higher average dopant concentration than the Hall plate 208, which may accrue the advantages disclosed in reference to FIG. 1C.

Figure 2F:
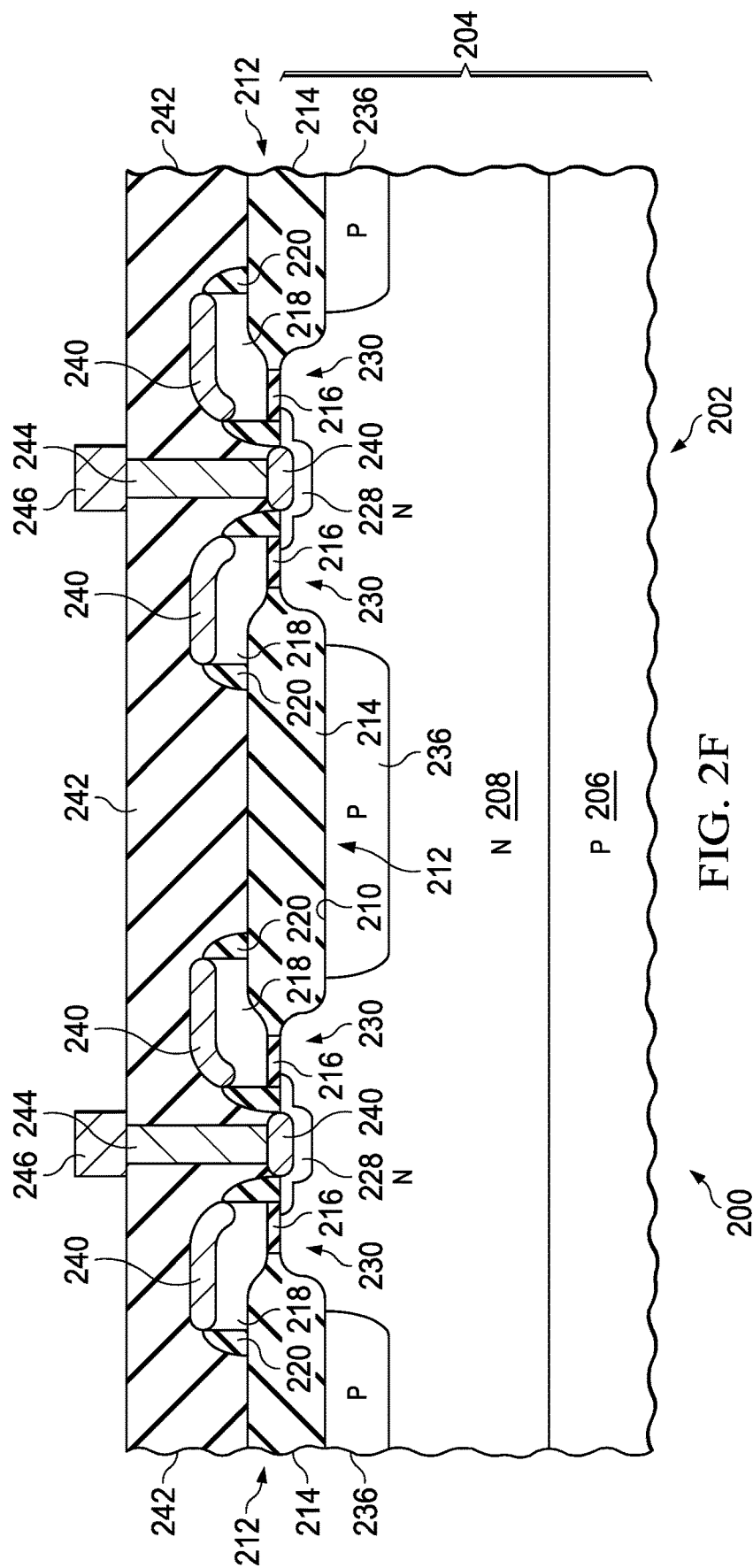

Referring to FIG. 2F, metal silicide 240 may subsequently be formed on exposed silicon on the contact regions 228 at the top surface 210, and on the polysilicon in the conductive spacers 218, if present. The metal silicide 240 may have any of the compositions disclosed in reference to the metal silicide 140 of FIG. 1E.

A PMD layer 242 is formed over the microelectronic device 200. The PMD layer 242 is electrically non-conductive, and may have a structure similar to that disclosed for the PMD layer 142 of FIG. 1E. Having the conductive spacers 218 and the screen structure 236 between the Hall plate 208 and the PMD layer 242 may accrue the advantage disclosed in reference to the Hall sensor 102 of FIG. 1E.

Contacts 244 are formed through the PMD layer 242, making electrical connections to the metal silicide 240 on the conductive spacers 218 and the contact regions 228. Interconnects 246 are formed on the PMD layer 242, making electrical connections to the contacts 244. The contacts 244 and the interconnects 246 are electrically conductive. The interconnects 246 are electrically connected to the Hall plate 208 through the contacts 244, the metal silicide 240, and the contact regions 228.

Figure 3A:
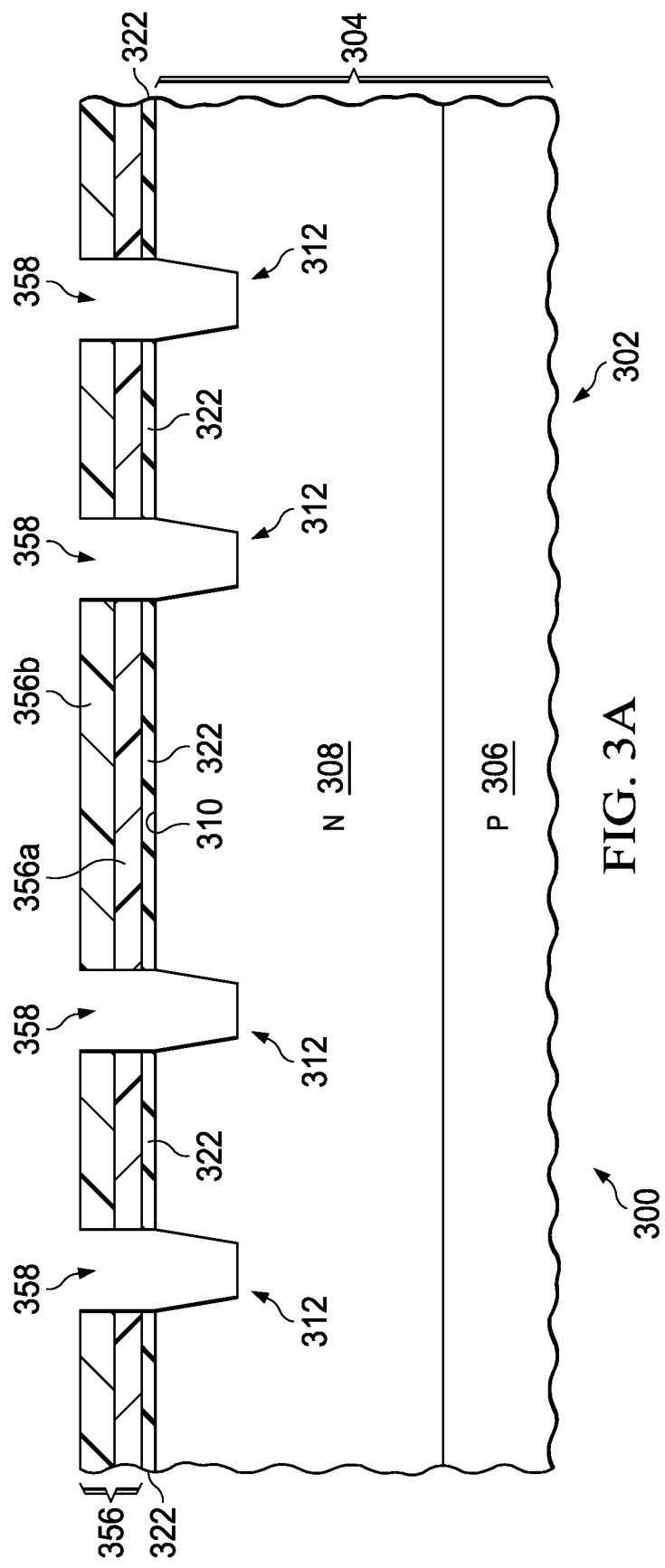
FIG. 3A through FIG. 3G are cross sections of another example microelectronic device that includes a Hall sensor, depicting stages of an example method of forming the microelectronic device.

FIG. 3A through FIG. 3G are cross sections of another example microelectronic device 300 that includes a Hall sensor 302, depicting stages of an example method of forming the microelectronic device 300. Referring to FIG. 3A, the microelectronic device 300 is formed in and on a substrate 304 that includes a semiconductor material 306. The microelectronic device 300 and the substrate 304 may be manifested as any of the examples disclosed in reference to the microelectronic device 100 and the substrate 104 of FIG. 1A. The semiconductor material 306 may include primarily silicon, with dopant elements. In this example, the semiconductor material 306 may be p-type, as indicated in FIG. 3A. The Hall sensor 302 includes a Hall plate 308 in the semiconductor material 306. The Hall plate 308 has a first conductivity type; in this example, the Hall plate 308 may be n-type, as indicated in FIG. 3A. The Hall plate 308 extends to a top surface 310 of the substrate 304.

A protective layer 322 of silicon dioxide is formed at the top surface. The protective layer 322 may be formed by a thermal oxidation process, and may be 5 nanometers to 25 nanometers thick, by way of example. An isolation structure 312 of the Hall sensor 302, shown in FIG. 3C, is formed by a trench/fill process. The trench/fill process starts by forming a trench etch mask 356 over the protective layer 322, exposing areas for a subsequently-formed isolation structure 312, shown in FIG. 3C. The trench etch mask 356 may include a first sublayer 356a of silicon nitride on the protective layer 322, and a second sublayer 356b of photoresist on the first sublayer 356a. The first sublayer 356a may be formed by forming a silicon nitride layer, not shown, by an LPCVD process using dichlorosilane and ammonia. The silicon nitride layer may be 100 nanometers to 200 nanometers thick, by way of example. The second sublayer 356b may be formed by a photolithographic process. After the second sublayer 356b, silicon nitride may be removed from the silicon nitride layer where exposed by the second sublayer 356b, leaving the silicon nitride under the second sublayer 356b to form the first sublayer 356a. The silicon nitride may be removed using an RIE process with fluorine radicals and hydrogen radicals, for example. Other layer structures, compositions, and formation methods for the trench etch mask 356 are within the scope of this example.

Isolation trenches 358 for the isolation structure 312 are formed in the substrate 304 by removing the protective layer 322 and removing the semiconductor material 306 where exposed by the trench etch mask 356, to a depth of 200 nanometers to 600 nanometers, by way of example. The protective layer 322 may be removed using an RIE process with fluorine radicals and carbon or hydrogen radicals, for example. The semiconductor material 306 may be removed using an RIE process with fluorine radicals, for example. A portion or all of the photoresist in the second sublayer 356b may be eroded during removal of the semiconductor material 306 to form the isolation trenches 358.

Figure 3B:
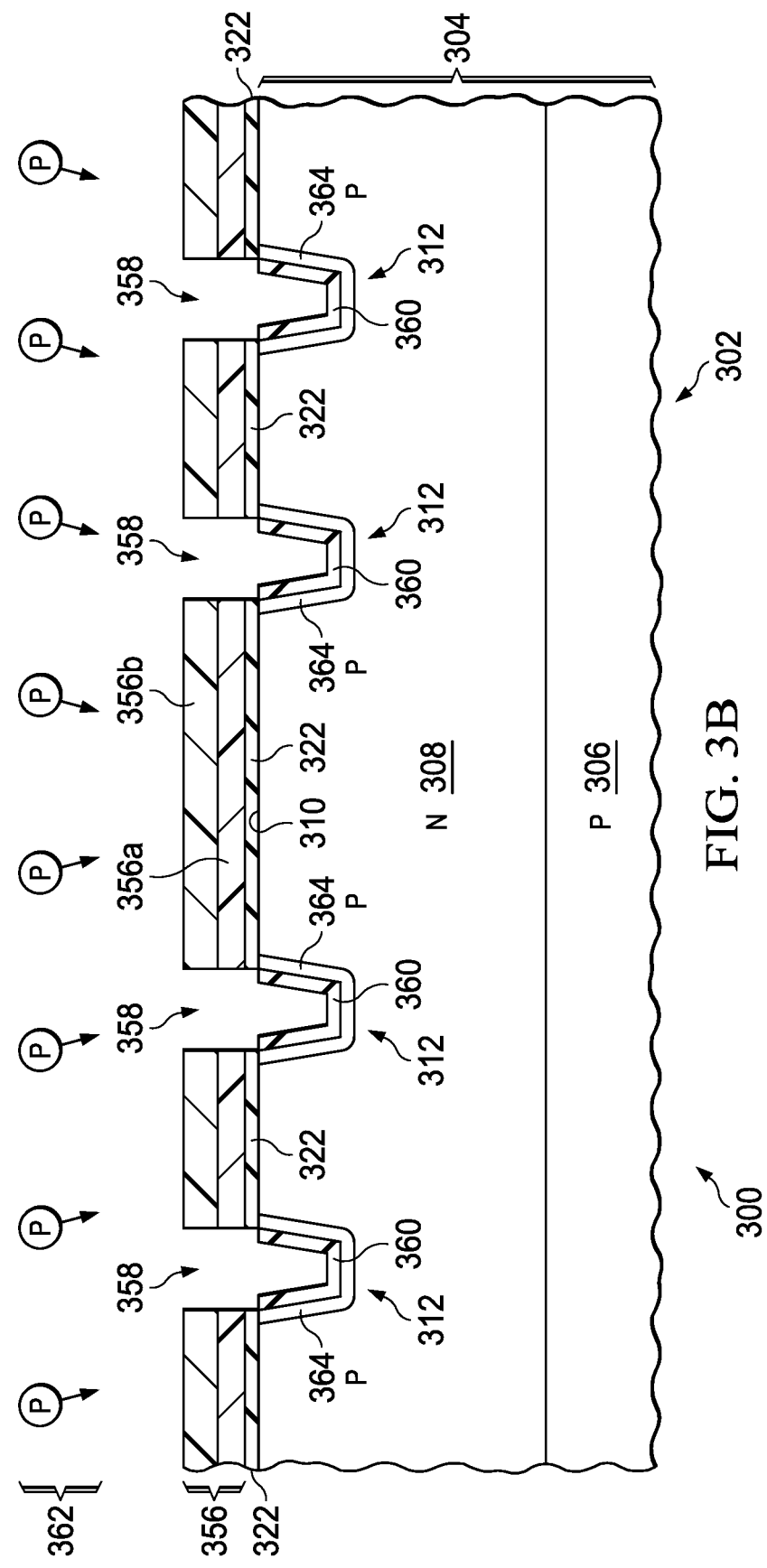
Figure 3C:
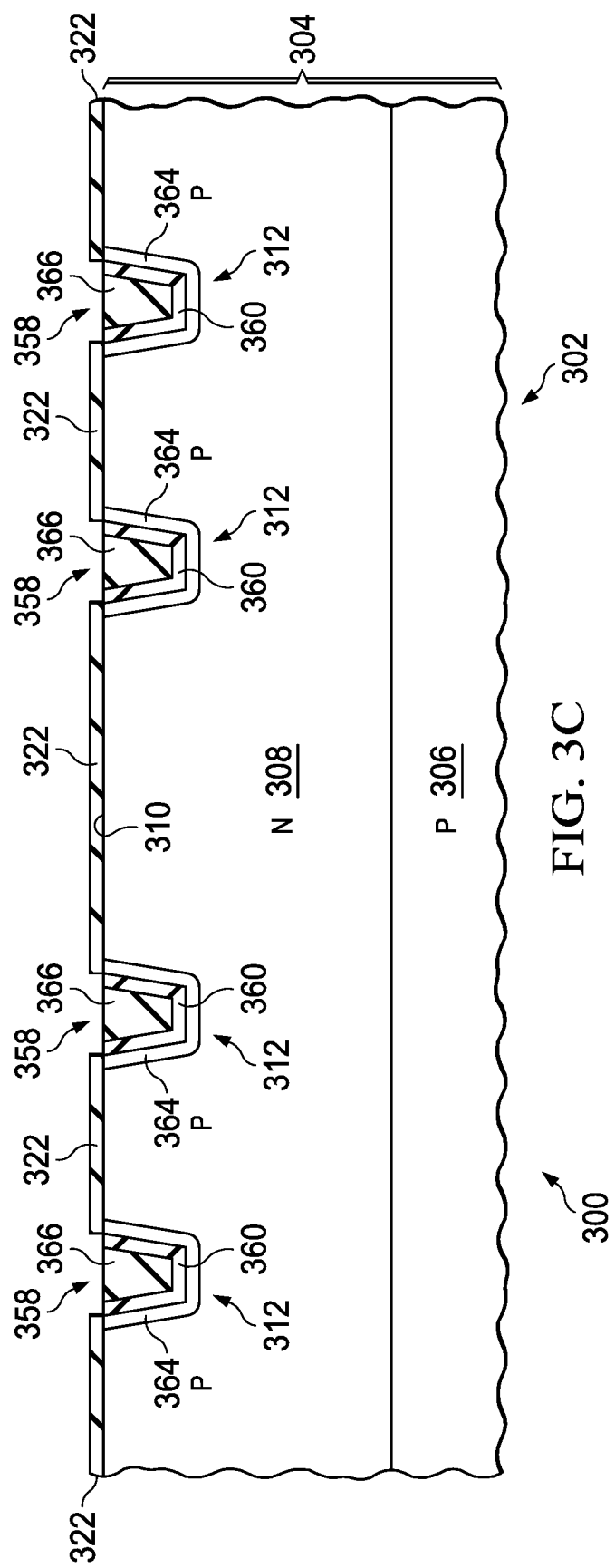

Referring to FIG. 3B, a trench liner 360 of silicon dioxide is formed on the semiconductor material 306 in the isolation trenches 358. The trench liner 360 may be 3 nanometers to 15 nanometers thick, by way of example. The trench liner 360 may be formed by a thermal oxidation process, or by a combination of a thermal oxidation process and a chemical vapor deposition process.

First p-type dopants 362, such as boron, gallium, or indium, are implanted into the semiconductor material 306 surrounding the isolation trenches 358. The first p-type dopants 362 may be implanted at a total dose of $1 \times 10^{12}$ ions/cm$^2$ to $1 \times 10^{14}$ ions/cm$^2$, by way of example. The first p-type dopants 362 may be implanted at an implant energy sufficient to place at least half of the first p-type dopants 362 within 10 nanometers of the isolation trenches 358. The first p-type dopants 362 are blocked from areas of the semiconductor material 306 outside of the isolation trenches 358 by a remaining portion of the trench etch mask 356.

The second sublayer 356b of the trench etch mask 356 is removed. The second sublayer 356b may be removed by a combination of an oxygen plasma process and a wet etch process. In one version of this example, the second sublayer 356b may be removed after the first p-type dopants 362 are implanted, which may advantageously use the second sublayer 356b to enhance blocking the first p-type dopants 362. In another version, the second sublayer 356b may be removed before the first p-type dopants 362 are implanted, which may advantageously facilitate removal of the second sublayer 356b by eliminating hardening of the photoresist by the first p-type dopants 362.

After the second sublayer 356b is removed, the substrate 304 is heated to activate the implanted first p-type dopants 362 to form a sheath structure 364 of the Hall sensor 302 in the semiconductor material 306 surrounding the isolation trenches 358. The substrate 304 may be heated in a rapid thermal anneal, a spike anneal, or a flash anneal, by way of example. The sheath structure 364 has a second conductivity type opposite from the first conductivity type of the Hall plate 308. In this example, the sheath structure 364 is p-type.

The first sublayer 356a of the trench etch mask 356 is removed, leaving at least a portion of the trench liner 360 and the protective layer 322 in place. The first sublayer 356a may be removed by a wet etch process using hot phosphoric acid, for example. In one version of this example, the first sublayer 356a may be removed after the substrate 304 is heated to activate the implanted first p-type dopants 362. In another version, the first sublayer 356a may be removed before the substrate 304 is heated to activate the implanted first p-type dopants 362.

Referring to FIG. 3C, a trench fill material 366 is formed in the isolation trenches 358 on the trench liner 360. The trench fill material 366 of this example may be electrically conductive, and may include polysilicon, for example. The trench fill material 366 may be formed by forming polysilicon in the isolation trenches 358 and over the protective layer 322, and removing the polysilicon from over the protective layer 322 by an etchback process, a CMP process, or a combination of both. In an alternate version of this example, the trench fill material 366 may be non-conductive, and may include silicon dioxide, for example. A combination of the trench liner 360 and the trench fill material 366 in the isolation trenches 358 provides the isolation structure 312. The protective layer 322 may be removed after the trench fill material 366 is formed. The protective layer 322 may be removed by a wet etch process, for example.

Figure 3D:
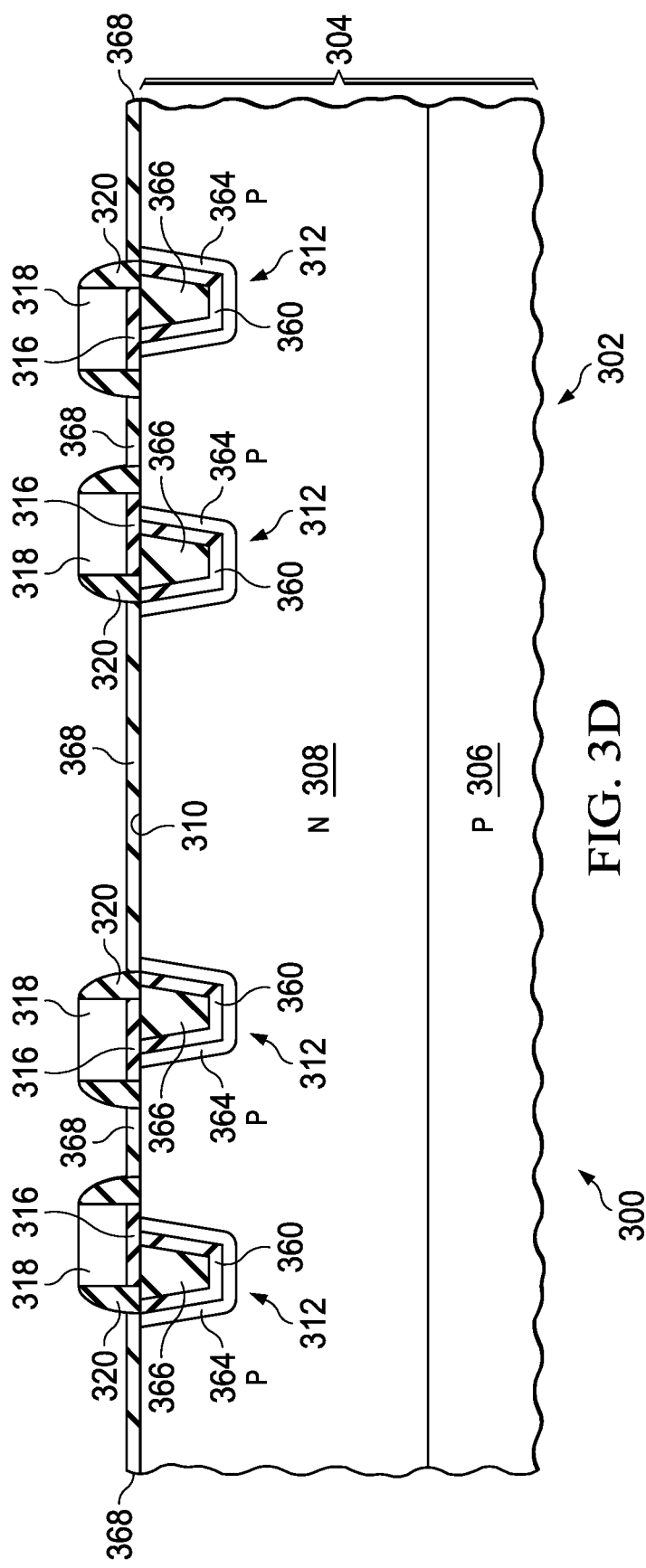

Referring to FIG. 3D, an insulating layer 316 of the Hall sensor 302 is formed on the substrate 304 at the top surface 310. The insulating layer 316 may have a composition as disclosed in reference to the insulating layer 116 of FIG. 1B, and may be formed by the corresponding processes disclosed for the insulating layer 116. The insulating layer 316 may vary in thickness across the semiconductor material 306, the trench liner 360, and the trench fill material 366.

Conductive spacers 318 of the Hall sensor 302 are formed on the insulating layer 316. The conductive spacers 318 extend at least partially over the isolation structure 312 and extend partially over the sheath structure 364 and the Hall plate 308 adjacent to the isolation structure 312. The conductive spacers 318 are electrically conductive, and may include polysilicon, for example. The insulating layer 316 outside of the conductive spacers 318 may be at least partially removed by subsequent fabrication processes.

Sidewalls 320 may optionally be formed on sides of the conductive spacers 318. The sidewalls 320 may have a composition and layer structure similar to the sidewalls 120 of FIG. 1B, and may be formed by processes disclosed in reference to the sidewalls 120. A protective layer 368 of silicon dioxide may be formed over the top surface 310 outside of the conductive spacers 318 and sidewalls 320, to protect the semiconductor material 306 during subsequent fabrication operations. The protective layer 368 may be formed on any remaining portion of the insulating layer 316 outside of the conductive spacers 318 and sidewalls 320.

Figure 3E:
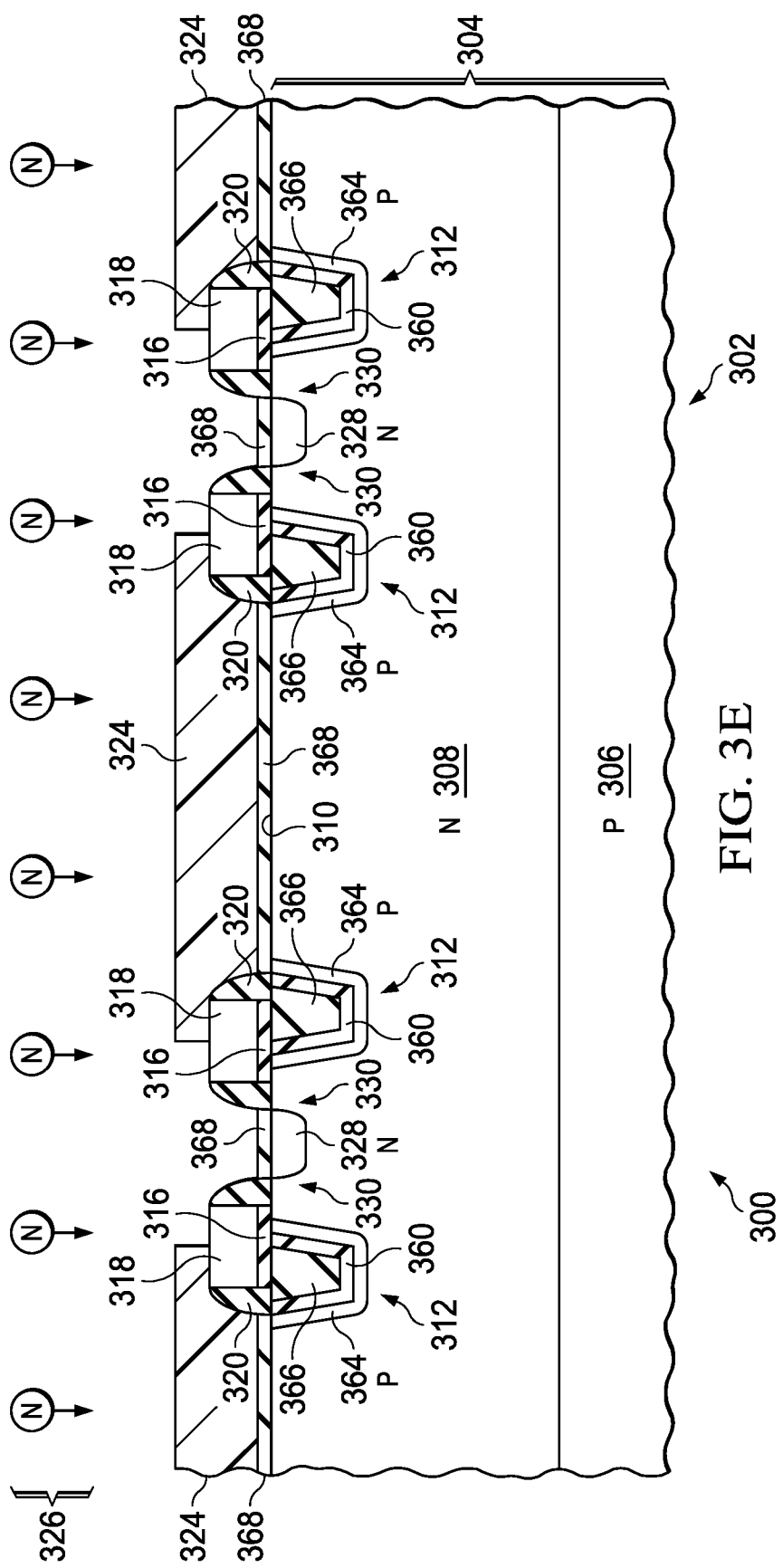

Referring to FIG. 3E, a contact implant mask 324 is formed over the microelectronic device 300, exposing areas between adjacent instances of the conductive spacers 318. The contact implant mask 324 may include photoresist, and may be formed by a photolithographic process. N-type dopants 326 are implanted into the Hall plate 308 where exposed by a combination of the contact implant mask 324, the conductive spacers 318, and the sidewalls 320, as disclosed in reference to the n-type dopants 126 of FIG. 1C. After the n-type dopants 326 are implanted, the contact implant mask 324 is removed. The substrate 304 is subsequently heated to activate the implanted n-type dopants 326 to form contact regions 328 of the Hall sensor 302. The substrate 304 may be heated in a rapid thermal anneal, a spike anneal, or a flash anneal, by way of example. The contact regions 328 make direct contact to the Hall plate 308. Each contact region 328 has the isolation structure 312 on two opposite sides, and is separated from the isolation structure 312 by a gap 330. Each contact region 328 may be wider than the immediately adjacent gap 330, the isolation structure 312 may extend deeper into the substrate 304 than the contact regions 328, and the contact regions 328 have a higher average dopant concentration than the Hall plate 308, which may accrue the advantages disclosed in reference to FIG. 1C.

Figure 3F:
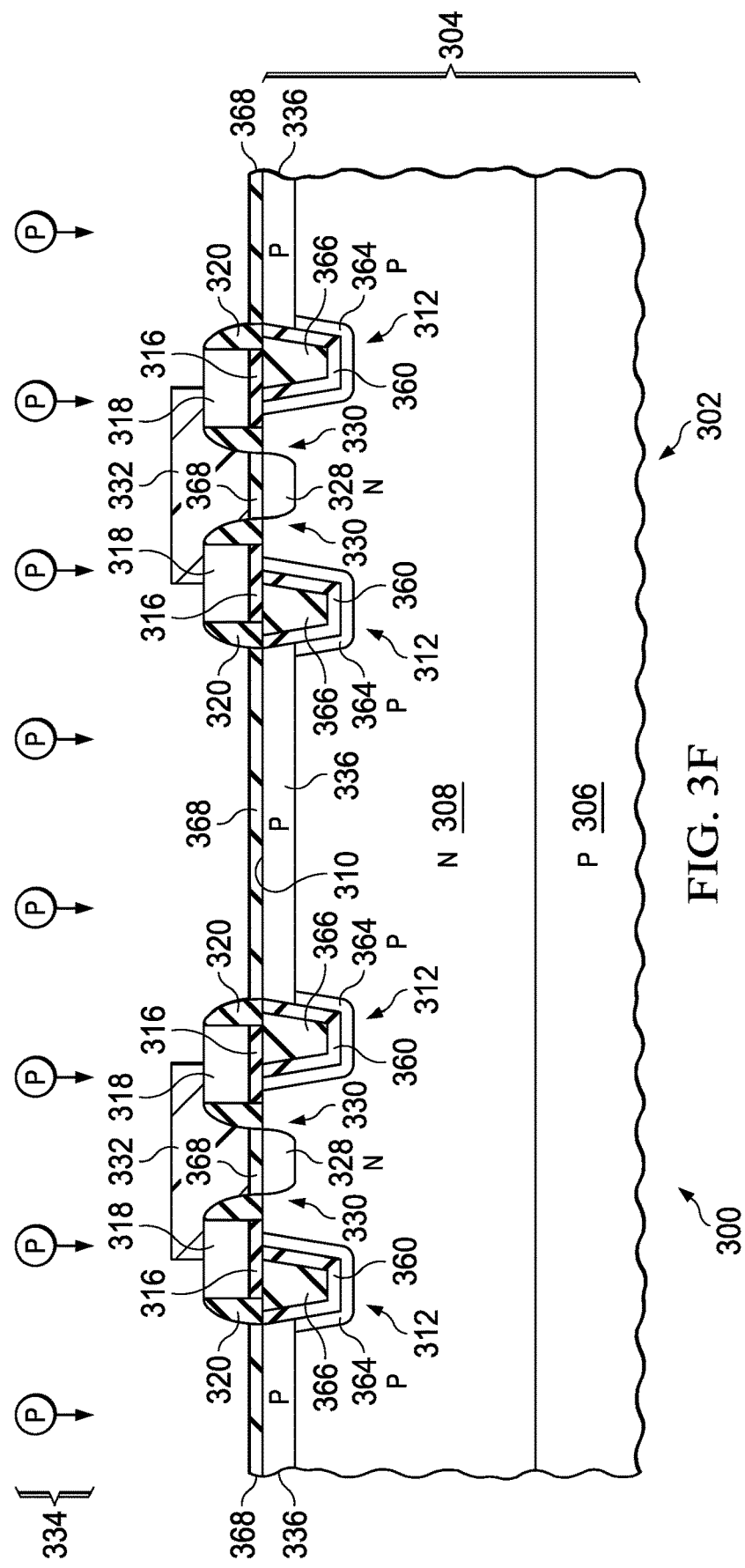

Referring to FIG. 3F, a screen implant mask 332 is formed over the microelectronic device 300, covering the contact regions 328 and the gaps 330 adjacent to the contact regions 328, and exposing the Hall plate 308 in areas between instances of the isolation structures 312 that are free of the contact regions 328 and the gaps 330. The screen implant mask 332 may have a composition similar to the contact implant mask 324 of FIG. 3E, and may be formed by a similar process. P-type dopants 334, such as boron, gallium, and indium, are implanted into the Hall plate 308 where exposed by a combination of the screen implant mask 332, the conductive spacers 318, and the sidewalls 320. The p-type dopants 334 may be implanted as disclosed in reference to the p-type dopants 134 of FIG. 1D. After the p-type dopants 334 are implanted, the screen implant mask 332 is removed. The screen implant mask 332 may be removed by a process similar to that used to remove the contact implant mask 324.

After the screen implant mask 332 is removed, the substrate 304 is heated to activate the implanted p-type dopants 334 to form a screen structure 336 of the Hall sensor 302 in the semiconductor material 306, between the Hall plate 308 and the top surface 310 of the substrate 304. The screen structure 336 has an opposite conductivity type from the Hall plate 308. The screen structure 336 may merge with the sheath structure 364, as depicted in FIG. 3F, which may advantageously provide more effective screening of trapped charge.

Figure 3G:
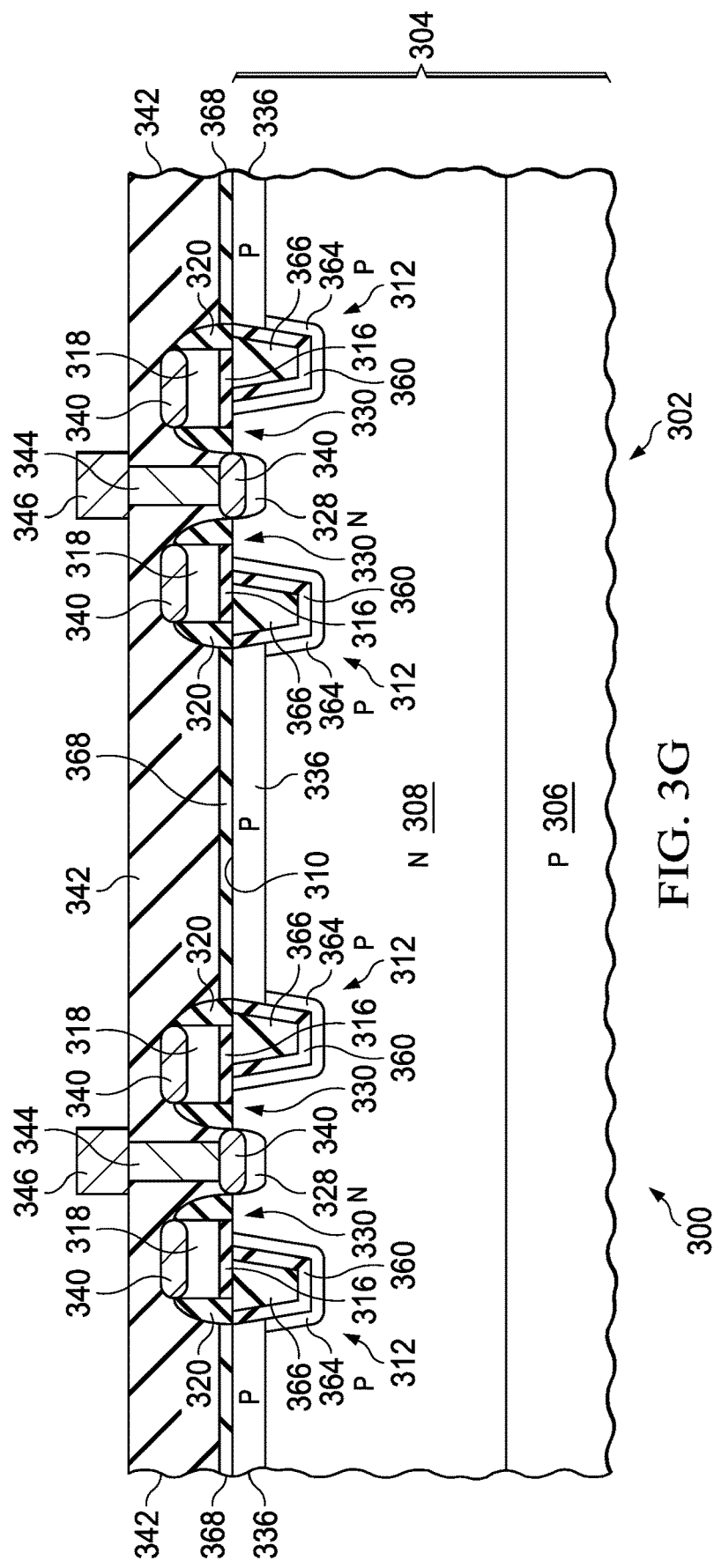

Referring to FIG. 3G, metal silicide 340 may subsequently be formed on exposed silicon on the contact regions 328 at the top surface 310, and on the polysilicon in the conductive spacers 318, if present. The metal silicide 340 may have any of the compositions disclosed in reference to the metal silicide 140 of FIG. 1E. A PMD layer 342 is formed over the microelectronic device 300. The PMD layer 342 is electrically non-conductive, and may have a structure similar to that disclosed for the PMD layer 142 of FIG. 1E. Having the conductive spacers 318 and the screen structure 336 between the Hall plate 308 and the PMD layer 342 may accrue the advantage disclosed in reference to the Hall sensor 102 of FIG. 1E. Contacts 344 are formed through the PMD layer 342, making electrical connections to the metal silicide 340 on the conductive spacers 318 and the contact regions 328. Interconnects 346 are formed on the PMD layer 342, making electrical connections to the contacts 344. The contacts 344 and the interconnects 346 are electrically conductive. The interconnects 346 are electrically connected to the Hall plate 308 through the contacts 344, the metal silicide 340, and the contact regions 328.

Figure 4:
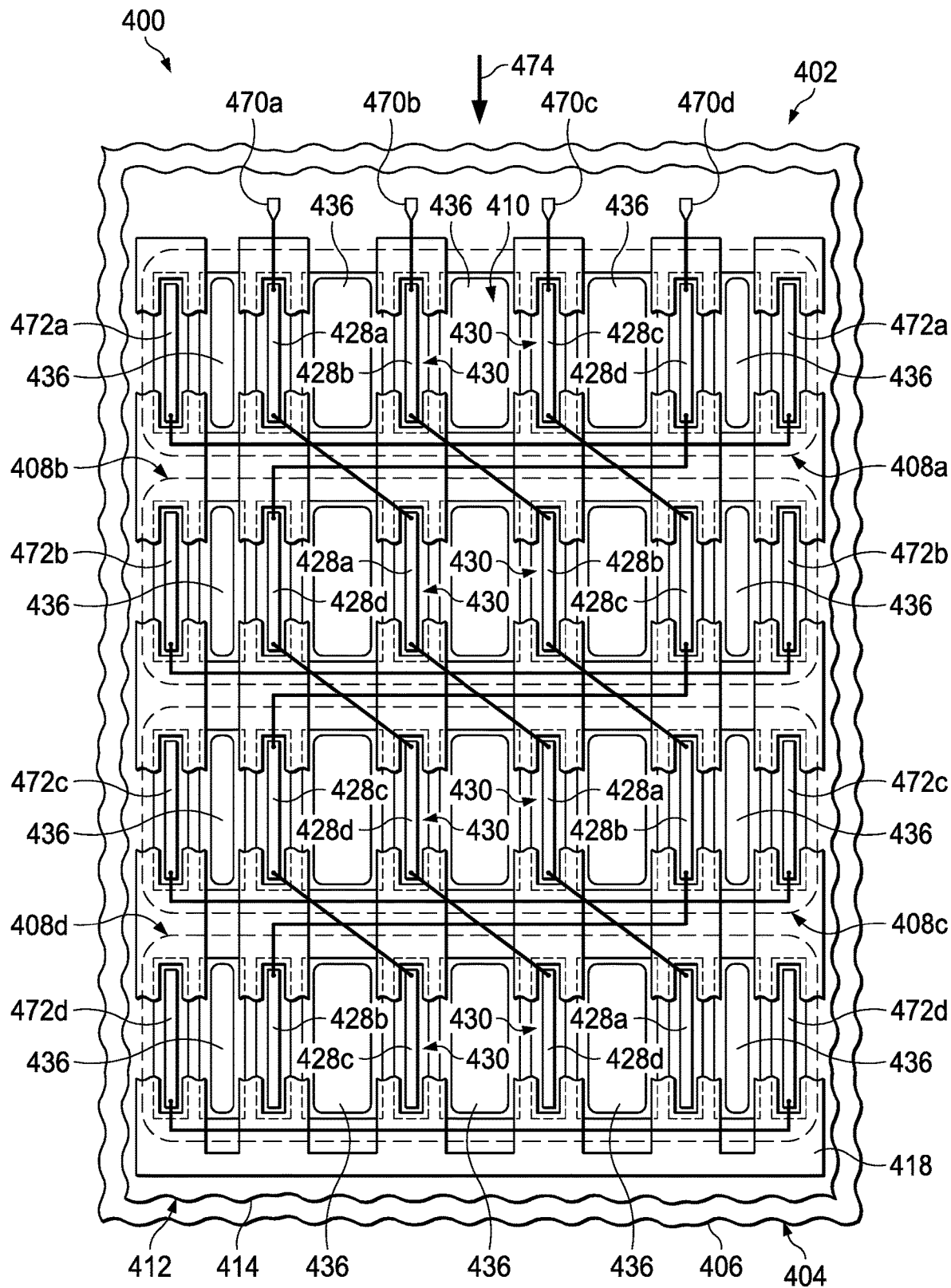
FIG. 4 is a top view of an example microelectronic device that includes a Hall sensor.

FIG. 4 is a top view of an example microelectronic device 400 that includes a Hall sensor 402. The microelectronic device 400 is formed in and on a substrate 404 that includes a semiconductor material 406. The microelectronic device 400 and the substrate 404 may be manifested as any of the examples disclosed in reference to the microelectronic device 100 and the substrate 104 of FIG. 1A. The substrate 404 has a top surface 410. In this example, the top surface 410 is in the plane of FIG. 4.

An isolation structure 412 of the Hall sensor 402 is formed in the substrate 404, extending to the top surface 410. The isolation structure 412 includes a dielectric material 414. In one version of this example, the isolation structure 412 may be formed by an STI process, as disclosed in reference to FIG. 1A. In another version, the isolation structure 412 may be formed by a LOCOS process, as disclosed in reference to FIG. 2A. In a further version, the isolation structure 412 may be formed by a trench/fill process, as disclosed in reference to FIG. 3A through FIG. 3C. The isolation structure 412 may extend past the Hall sensor 402 to provide a field relief oxide layer for other components, not shown, in the microelectronic device 400.

The Hall sensor 402 of this example includes a first Hall plate 408a, a second Hall plate 408b, a third Hall plate 408c, and a fourth Hall plate 408d, all in the semiconductor material 406. The Hall plates 408a, 408b, 408c, and 408d have a first conductivity type, and extend to the top surface 410 of the substrate 404. In this example, the Hall plates 408a, 408b, 408c, and 408d may be manifested as vertical Hall plates that are oriented parallel to each other; the Hall sensor 402 may be used to measure components of magnetic fields parallel to the top surface 410 of the substrate 404.

The Hall sensor 402 of this example includes four contact regions 428a, 428b, 428c, and 428d contacting each of the Hall plates 408a, 408b, 408c, and 408d in a linear array, as depicted in FIG. 4. The four instances of contact regions 428a are electrically connected in series, as indicated schematically in FIG. 4, to a first terminal 470a. Similarly, the four instances of contact regions 428b are electrically connected in series to a second terminal 470b, the four instances of contact regions 428c are electrically connected in series to a third terminal 470c, and the four instances of contact regions 428d are electrically connected in series to a fourth terminal 470d. Spatial ordering of the four contact regions 428a through 428d is sequentially transposed in each of the Hall plates 408a through 408d, as depicted in FIG. 4.

Each of the Hall plates 408a, 408b, 408c, and 408d has two exterior contact regions 472a, 472b, 472c, and 472d at opposite ends of the Hall plates 408a, 408b, 408c, and 408d, respectively, exterior to the contact regions 428a, 428b, 428c, and 428d. The two exterior contact regions 472a, 472b, 472c, and 472d in each Hall plate 408a, 408b, 408c, and 408d are electrically connected together, as depicted schematically in FIG. 4.

The isolation structure 412 extends on two opposite sides of each of the four contact regions 428a through 428d in each of the Hall plates 408a through 408d. The contact regions 428a through 428d are laterally separated from the isolation structure 412 by gaps 430. The isolation structure 412 may optionally extend on two opposite sides of each of the exterior contact regions 472a, 472b, 472c, and 472d.

A conductive spacer 418 extends over the gaps 430. The conductive spacer 418 is separated from the substrate 404 by an insulating layer, not shown in FIG. 4. The conductive spacer 418 and the insulating layer may have properties disclosed in reference to any of the conductive spacers 118, 218, or 318 and insulating layers 116, 216, or 316 of FIG. 1B, FIG. 2C, or FIG. 3D, respectively. The conductive spacer 418 may optionally extend over gaps between the isolation structure 412 and the exterior contact regions 472a, 472b, 472c, and 472d.

A screen structure 436 is formed in the semiconductor material 406 between the top surface 410 and the Hall plates 408a through 408d. The screen structure 436 may be formed as disclosed in reference to any of the screen structures 136, 236, or 336 of FIG. 1D, FIG. 2B, or 3F, respectively. A PMD layer, contacts, and interconnects of the microelectronic device 400 are not shown in FIG. 4, in order to show more clearly the elements of the Hall sensor 402.

During operation of the microelectronic device 400, a first bias potential may be applied to the first terminal 470a and a second, different, bias potential is applied to the third terminal 470c. In the first Hall plate 408a, a first current flows from the first contact region 428a into the first Hall plate 408a. A first branch of the first current flows through the first Hall plate 408a between the first contact region 428a and the third contact region 428c, and out through the third contact region 428c, generating a first signal potential at the second terminal 470b. A second branch of the first current flows through the first Hall plate 408a between the first contact region 428a and the exterior contact region 472a adjacent to the first contact region 428a, out through the exterior contact region 472a adjacent to the first contact region 428a, to the exterior contact region 472a opposite from the first contact region 428a, into the Hall plate 408a from the exterior contact region 472a opposite from the first contact region 428a, through the first Hall plate 408a between the third contact region 428c and the exterior contact region 472a opposite from the first contact region 428a, and out through the third contact region 428c, generating a second signal potential at the fourth terminal 470d.

A second current flows into the second Hall plate 408b at the first contact region 428a, through the second Hall plate 408b, and out of the second Hall plate 408b at the third contact region 428c, in an analogous manner to the first current in the first Hall plate 408a, adding to the first signal potential at the second terminal 470b and adding to the second signal potential at the fourth terminal 470d. Similarly, a third current flows through the third Hall plate 408c and a fourth current flows through the fourth Hall plate 408d, further adding to the first signal potential at the second terminal 470b and adding to the second signal potential at the fourth terminal 470d.

While the first and second bias potentials are applied, the first signal potential is acquired from the second terminal 470b and the second signal potential is acquired from the fourth terminal 470d. A difference between the first and second signal potentials is used to generate a first estimate of a magnetic field component 474 that is parallel to the top surface 410 of the substrate 404 and perpendicular to the linear arrays of the contact regions 428a through 428d in each of the Hall plates 408a through 408d.

Subsequently, the first and second bias potentials may be applied to the second and fourth terminals 470b and 470d, while third and fourth signal potentials are acquired from the third and first terminals 470c and 470a, respectively. A difference between the third and fourth signal potentials is used to generate a second estimate of the magnetic field component 474. Subsequently, the first and second bias potentials may be applied to the third and first terminals 470c and 470a, while fifth and sixth signal potentials are acquired from the fourth and second terminals 470d and 470b, respectively. A difference between the fifth and sixth signal potentials is used to generate a third estimate of the magnetic field component 474. Subsequently, the first and second bias potentials may be applied to the fourth and second terminals 470d and 470b, while seventh and eighth signal potentials are acquired from the first and third terminals 470a and 470c, respectively. A difference between the seventh and eighth signal potentials is used to generate a fourth estimate of the magnetic field component 474. The first through fourth estimates are averaged to generate an averaged estimate of the magnetic field component 474, which may have a lower offset and lower noise than an estimate generated using a single Hall plate or a single pair of signal potentials.

In one version of this example, during operation of the microelectronic device 400, the conductive spacer 418 may be biased to form a depletion region in the Hall plates 408a through 408d in the gaps 430 immediately under the conductive spacer 418, which may advantageously reduce recombination of charge carriers in the Hall plates 408a through 408d in the gaps 430. In another version, the conductive spacer 418 may be biased to provide a flatband condition in the Hall plates 408a through 408d in the gaps 430 immediately under the conductive spacer 418, which may also reduce recombination of charge carriers in the Hall plates 408a through 408d in the gaps 430. Other bias conditions for the conductive spacer 418 are within the scope of this example.

Figure 5:
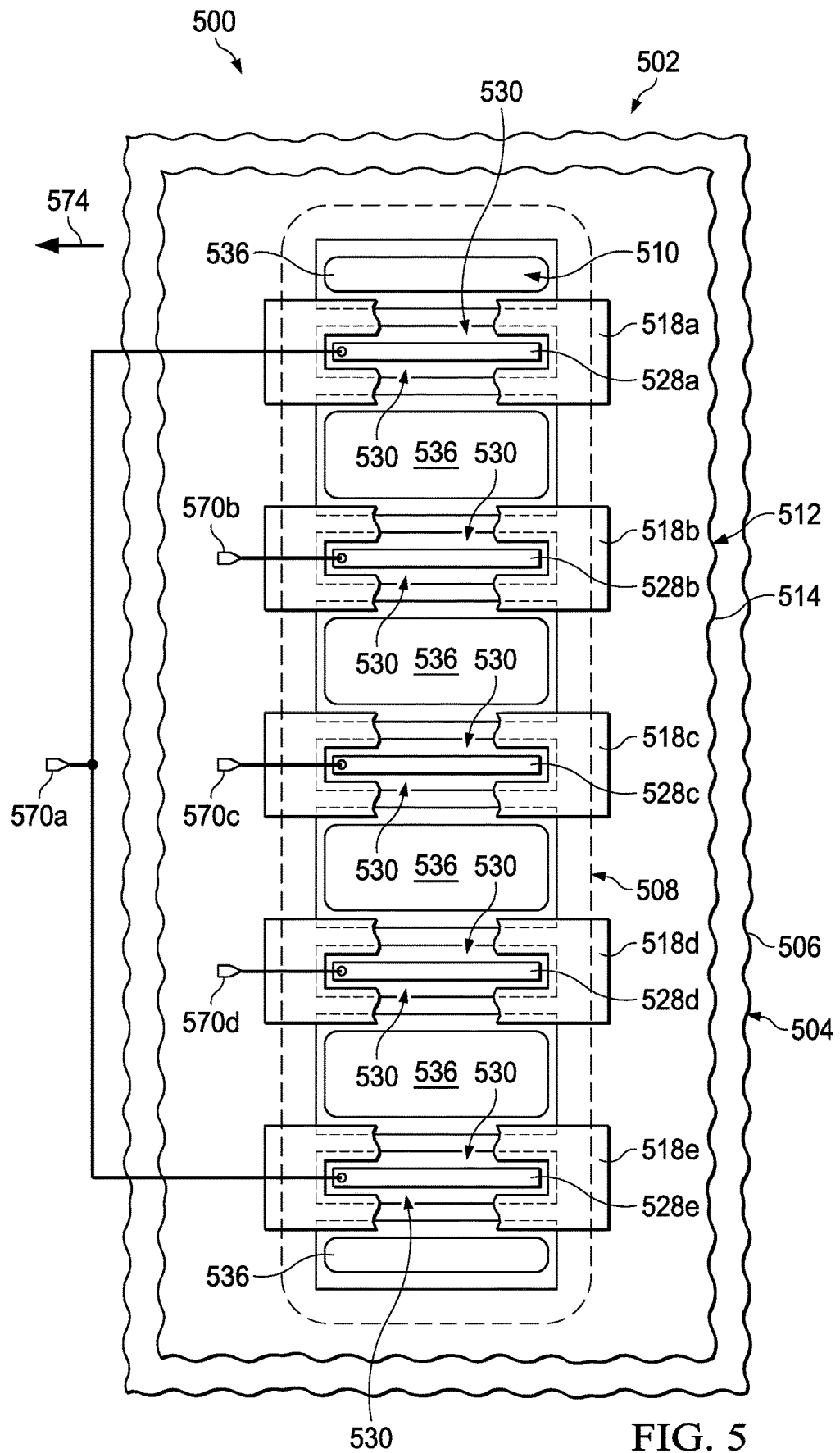
FIG. 5 is a top view of another example microelectronic device that includes a Hall sensor.

FIG. 5 is a top view of another example microelectronic device 500 that includes a Hall sensor 502. The microelectronic device 500 is formed in and on a substrate 504 that includes a semiconductor material 506. The microelectronic device 500 and the substrate 504 may be manifested as any of the examples disclosed in reference to the microelectronic device 100 and the substrate 104 of FIG. 1A. The substrate 504 has a top surface 510. In this example, the top surface 510 is in the plane of FIG. 5.

An isolation structure 512 of the Hall sensor 502 is formed in the substrate 504, extending to the top surface 510. The isolation structure 512 includes a dielectric material 514. The isolation structure 512 may be formed by an STI process, a LOCOS process, or a trench/fill process.

The Hall sensor 502 of this example includes a Hall plate 508 in the semiconductor material 506. The Hall plate 508 has a first conductivity type, and extends to the top surface 510 of the substrate 504. In this example, the Hall plate 508 may be manifested as a vertical Hall plate; the Hall sensor 502 may be used to measure components of magnetic fields parallel to the top surface 510 of the substrate 504.

The Hall sensor 502 of this example includes a first through a fifth contact regions 528a, 528b, 528c, 528d, and 528e, respectively, contacting the Hall plate 508 in a linear array configuration, as depicted in FIG. 5. The first contact region 528a and the fifth contact region 528e, at opposite ends of the linear array, are electrically connected to a first terminal 570a. The second through fourth contact regions 528b through 528d are electrically connected to a second through a fourth terminal 570b through 570d, respectively.

The isolation structure 512 extends on two opposite sides of each of the four contact regions 528a through 528e in the Hall plate 508. The contact regions 528a through 528e are laterally separated from the isolation structure 512 by gaps 530.

The Hall sensor 502 includes five conductive spacers 518a, 518b, 518c, 518d, and 518e extending over the gaps 530 on both sides of the contact regions 528a through 528e, respectively. The conductive spacers 518a through 518e are separated from the substrate 504 by an insulating layer, not shown in FIG. 5. The conductive spacers 518a through 518e and the insulating layer may have properties disclosed in reference to any of the conductive spacers 118, 218, or 318 and insulating layers 116, 216, or 316 of FIG. 1B, FIG. 2C, or FIG. 3D, respectively.

A screen structure 536 is formed in the semiconductor material 506 between the top surface 510 and the Hall plate 508. The screen structure 536 may be formed as disclosed in reference to any of the screen structures 136, 236, or 336 of FIG. 1D, FIG. 2B, or 3F, respectively. A PMD layer, contacts, and interconnects of the microelectronic device 500 are not shown in FIG. 5, in order to show more clearly the elements of the Hall sensor 502.

During operation of the microelectronic device 500, a first bias potential may be applied to the first terminal 570a and a second, different, bias potential is applied to the third terminal 570c. While the first and second bias potentials are applied, a first signal potential is acquired from the second terminal 570b and a second signal potential is acquired from the fourth terminal 570d. A difference between the first and second signal potentials is used to generate a first estimate of the magnetic field component 574 that is parallel to the top surface 510 of the substrate 504 and perpendicular to the linear array of the contact regions 528a through 528e. Subsequently, the first and second bias potentials may be applied to the second and fourth terminals 570b and 570d, while third and fourth signal potentials are acquired from the third and first terminals 570c and 570a, respectively. A difference between the third and fourth signal potentials is used to generate a second estimate of the magnetic field component 574. Subsequently, the first and second bias potentials may be applied to the third and first terminals 570c and 570a, while fifth and sixth signal potentials are acquired from the fourth and second terminals 570d and 570b, respectively. A difference between the fifth and sixth signal potentials is used to generate a third estimate of the magnetic field component 574. Subsequently, the first and second bias potentials may be applied to the fourth and second terminals 570d and 570b, while seventh and eighth signal potentials are acquired from the first and third terminals 570a and 570c, respectively. A difference between the seventh and eighth signal potentials is used to generate a fourth estimate of the magnetic field component 574. The first through fourth estimates are averaged to generate an averaged estimate of the magnetic field component 574, which may have a lower offset and lower noise than an estimate generated using a single Hall plate or a single pair of signal potentials. The Hall sensor 502 having the single Hall plate 508 may enable a smaller area for the microelectronic device 500.

In one version of this example, the conductive spacers 518a through 518e may be biased to a same potential during measurement of the magnetic field component 574. In another version, instances of the conductive spacers 518a through 518e surrounding instances of the contact regions 528a through 528e which have the first or second bias potentials applied may be biased at a first potential, to provide a flatband condition, for example, while instances of the conductive spacers 518a through 518e surrounding instances of the contact regions 528a through 528e from which signal potentials are acquired may be biased at a second potential, to form a depletion region, for example. Biasing the conductive spacers 518a through 518e may advantageously improve the offset and noise level of the Hall sensor 502.

Figure 6:
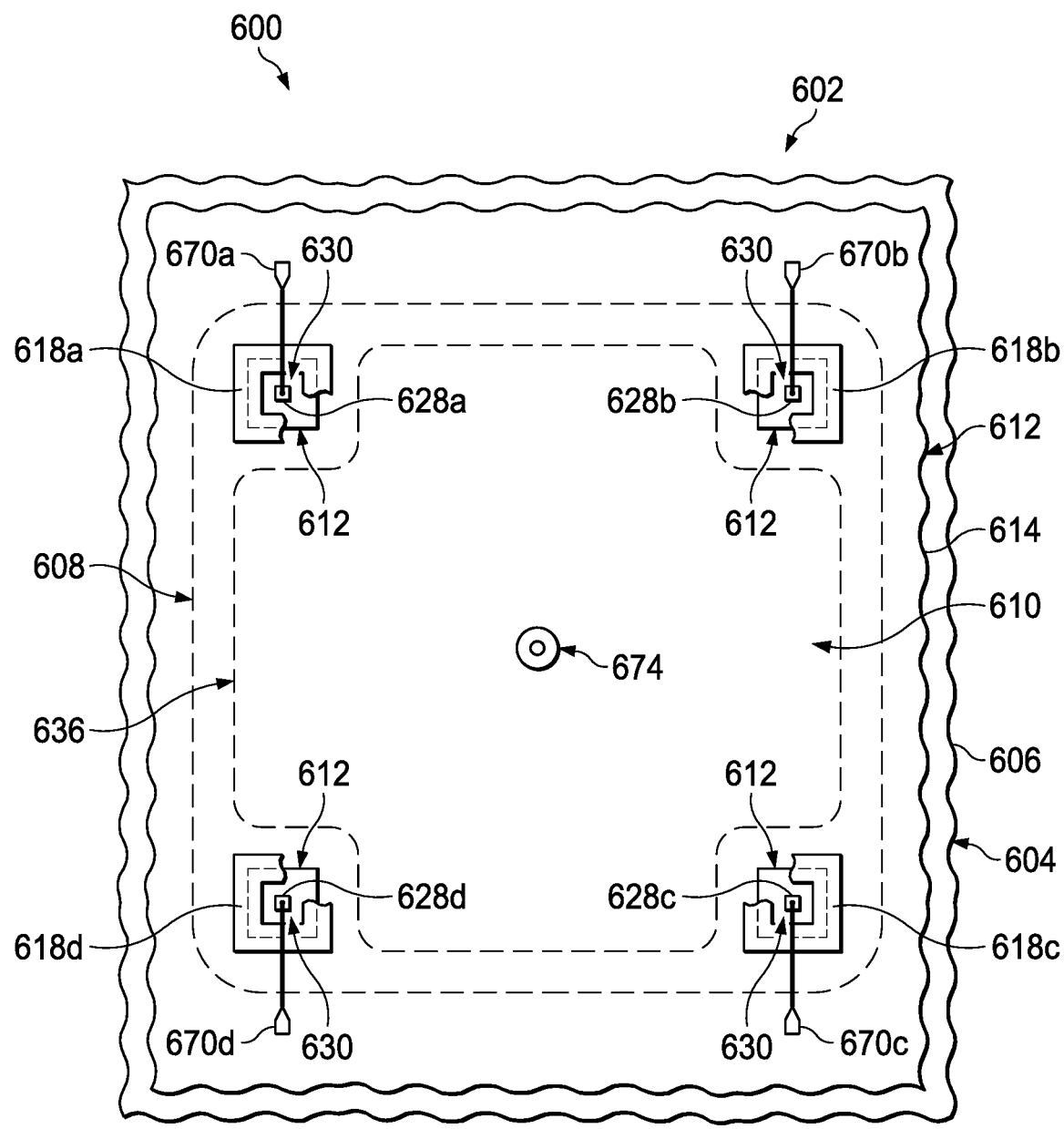
FIG. 6 is a top view of a further example microelectronic device that includes a Hall sensor.

FIG. 6 is a top view of a further example microelectronic device 600 that includes a Hall sensor 602. The microelectronic device 600 is formed in and on a substrate 604 that includes a semiconductor material 606. The microelectronic device 600 and the substrate 604 may be manifested as any of the examples disclosed in reference to the microelectronic device 100 and the substrate 104 of FIG. 1A. The substrate 604 has a top surface 610. The top surface 610 is in the plane of FIG. 6.

An isolation structure 612 of the Hall sensor 602 is formed in the substrate 604, extending to the top surface 610. The isolation structure 612 includes a dielectric material 614. The isolation structure 612 may be formed by an STI process, a LOCOS process, or a trench/fill process.

The Hall sensor 602 of this example includes a Hall plate 608 in the semiconductor material 606. The Hall plate 608 has a first conductivity type, and extends to the top surface 610 of the substrate 604. In this example, the Hall plate 608 may be manifested as a horizontal Hall plate; the Hall sensor 602 may be used to measure components 674, of magnetic fields perpendicular to the top surface 610 of the substrate 604.

The Hall sensor 602 of this example includes a first through a fourth contact regions 628a, 628b, 628c, and 628d, respectively, contacting the Hall plate 608 at corners of a square array configuration, as depicted in FIG. 6. The contact regions 628a through 628d are electrically connected to a first through a fourth terminal 670a, 670b, 670c, and 670d, respectively.

In this example, the isolation structure 612 laterally surrounds each of the four contact regions 628a through 628e in the Hall plate 608. The contact regions 628a through 628e are laterally separated from the isolation structure 612 by gaps 630.

The Hall sensor 602 includes four conductive spacers 618a, 618b, 618c, and 618d extending over the gaps 630 and laterally surrounding the contact regions 628a through 628d, respectively. The conductive spacers 618a through 618d are separated from the substrate 604 by an insulating layer, not shown in FIG. 6. The conductive spacers 618a through 618d and the insulating layer may have properties disclosed in reference to any of the conductive spacers 118, 218, or 318 and insulating layers 116, 216, or 316 of FIG. 1B, FIG. 2C, or FIG. 3D, respectively.

A screen structure 636 is formed in the semiconductor material 606 between the top surface 610 and the Hall plate 608. In this example, the screen structure 636 may be located under the isolation structure 612 and above the Hall Plate 608. The screen structure 636 may be formed as disclosed in reference to any of the screen structures 136, 236, or 336 of FIG. 1D, FIG. 2B, or 3F, respectively. A PMD layer, contacts, and interconnects of the microelectronic device 600 are not shown in FIG. 6, in order to show more clearly the elements of the Hall sensor 602.

The Hall sensor 602 of this example may be operated in several modes to measure the magnetic field component 674 that is perpendicular to the top surface 610 of the substrate 604. In a first mode of operation, a first bias potential may be applied to the first terminal 670a and a second, different, bias potential is applied to the third terminal 670c. While the first and second bias potentials are applied, a first signal potential is acquired from the second terminal 670b and a second signal potential is acquired from the fourth terminal 670d. A difference between the first and second signal potentials is used to generate a first estimate of the magnetic field component 674 that is perpendicular to the top surface 610 of the substrate 604.

In a second mode, the first and second bias potentials may be applied to the first and third terminals 670*a* and 670*c*, respectively, while third and fourth signal potentials are acquired from the second and fourth terminals 670*b* and 670*d*, respectively. Subsequently, the first and second bias potentials may be applied to the second and fourth terminals 670*b* and 670*d*, respectively, while fifth and sixth signal potentials are acquired from the third and first terminals 670*c* and 670*a*, respectively. An average of a difference between third and fourth signal potentials and a difference between the fifth and sixth signal potentials is used to generate a second estimate of the magnetic field component 674, which may have lower offset and lower noise than the first estimate.

Further modes of operation may include applying the first and second bias potentials to every opposing pair of the terminals 670*a* through 670*d* while measuring pairs of signal potentials on the remaining pair of the terminals 670*a* through 670*d*, and averaging the differences between the pairs of signal potentials. Having the isolation structure 612 and the conductive spacers 618*a* through 618*d* laterally surrounding each of the contact regions 628*a* through 628*d* may advantageously improve magnetic gain, offset and noise level of the Hall sensor 602.

Various features of the examples disclosed herein may be combined in other manifestations of example microelectronic devices having Hall sensors. Any of the Hall sensors 102, 202, 302, 402, 502, or 602 may have isolation structures 112, 212, 312, 412, 512, or 612, respectively, formed by an STI process, a LOCOS process, or a trench fill process. Any of the Hall sensors 102, 202, 302, 402, 502, or 602 may have isolation structures 112, 212, 312, 412, 512, or 612, respectively, which extend across the Hall plates 108, 208, 308, 408*a* through 408*d*, 508, or 608, respectively, for example, as depicted in FIG. 2F or FIG. 6. Conversely, any of the Hall sensors 102, 202, 302, 402, 502, or 602 may have isolation structures 112, 212, 312, 412, 512, or 612, respectively, which have open areas over the Hall plates 108, 208, 308, 408*a* through 408*d*, 508, or 608, respectively, for example, as depicted in FIG. 1E, FIG. 3G, FIG. 4, or FIG. 5. Any of the Hall sensors 102, 202, 302, 402, 502, or 602 may have isolation structures 112, 212, 312, 412, 512, or 612, respectively, which extend deeper into the substrate 104, 204, 304, 404, 504, or 604 than the corresponding screen structures 136, 236, 336, 436, 536, or 636, for example, as depicted in FIG. 1E or FIG. 3G. Conversely, any of the Hall sensors 102, 202, 302, 402, 502, or 602 may have screen structures 136, 236, 336, 436, 536, or 636, respectively, which extend deeper into the substrate 104, 204, 304, 404, 504, or 604 than the corresponding isolation structures 112, 212, 312, 412, 512, or 612, for example, as depicted in FIG. 2F. Any of the Hall sensors 102, 202, 302, 402, 502, or 602 may have contact regions 128, 228, 328, 428*a* through 428*d*, 528*a* through 528*e*, or 628*a* through 628*d*, respectively, which include contact extension regions, for example, as depicted in FIG. 2D through FIG. 2F. Any of the Hall sensors 102, 202, 302, 402, 502, or 602 may have sheath structures surrounding the isolation structures 112, 212, 312, 412, 512, or 612, respectively, for example, as depicted in FIG. 3G. Any of the Hall sensors 102, 202, or 302 may have vertical Hall plates 108, 208, or 308, respectively, for example, as depicted in FIG. 4, or FIG. 5. Any of the Hall sensors 102, 202, or 302 may have horizontal Hall plates 108, 208, or 308, respectively, for example, as depicted in FIG. 6.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A microelectronic device, comprising:
    a substrate including a semiconductor material; and
    a Hall sensor, including:
        a Hall plate in the semiconductor material, the Hall plate having a first conductivity type;
        a contact region of the Hall sensor in the semiconductor material contacting the Hall plate, the contact region having the first conductivity type;
        an isolation structure including dielectric material on two opposite sides of the contact region, the isolation structure being laterally separated from the contact region by a gap, the isolation structure contacting the semiconductor material; and
        a conductive spacer of electrically conductive material over the gap, the conductive spacer being separated from the semiconductor material by an insulating layer.

2. The microelectronic device of claim 1, the Hall sensor further including a screen structure in the semiconductor material between the Hall plate and a top surface of the substrate, located on the two opposite sides of the isolation structure, the screen structure having a second, opposite, conductivity type, wherein at least a portion of the screen structure is laterally separated from the contact region by the isolation structure.

3. The microelectronic device of claim 2, wherein the isolation structure extends deeper into the substrate than the screen structure.

4. The microelectronic device of claim 2, wherein the screen structure extends partially under the isolation structure.

5. The microelectronic device of claim 1, wherein the isolation structure extends deeper into the substrate than the contact region.

6. The microelectronic device of claim 1, wherein the contact region has a greater average dopant concentration than the Hall plate.

7. The microelectronic device of claim 1, further comprising a sheath structure in the semiconductor material surrounding the isolation structure, the sheath structure having a second, opposite, conductivity type.

8. The microelectronic device of claim 1, wherein the isolation structure extends in a trench in the substrate.

9. The microelectronic device of claim 8, wherein the isolation structure includes an electrically conductive material extending into the trench.

10. The microelectronic device of claim 1, wherein the isolation structure includes thermal oxide with tapered edges.

11. The microelectronic device of claim 1, further including sidewalls on the conductive spacer, wherein the contact region includes contact extensions that extend under the sidewalls and partially under the conductive spacer.

12. The microelectronic device of claim 1, wherein the Hall plate is a vertical Hall plate, and the contact region extends across the vertical Hall plate, the contact region having a length and a width, the length being more than twice the width.

13. The microelectronic device of claim 1, wherein the Hall plate is a horizontal Hall plate, the isolation structure laterally surrounds the contact region, and the conductive spacer laterally surrounds the contact region.

14. A method of forming a microelectronic device, comprising:
- forming a Hall plate in a semiconductor material of a substrate, the Hall plate having a first conductivity type;
- forming an isolation structure including dielectric material extending into the substrate and contacting the semiconductor material;
- forming a conductive spacer of electrically conductive material over the substrate, the conductive spacer being separated from the semiconductor material by an insulating layer; and
- forming a contact region having the first conductivity type in the semiconductor material, the contact region contacting the Hall plate, the contact region being laterally separated from the isolation structure by a gap, wherein the conductive spacer partially overlaps the gap.

15. The method of claim 14, further comprising forming a screen structure in the semiconductor material between the Hall plate and a top surface of the substrate, located on the two opposite sides of the isolation structure, the screen structure having a second, opposite, conductivity type, wherein at least a portion of the screen structure is laterally separated from the contact region by the isolation structure.

16. The method of claim 15, wherein the isolation structure extends deeper into the substrate than the screen structure.

17. The method of claim 15, wherein the screen structure extends partially under the isolation structure.

18. The method of claim 14, wherein the isolation structure extends deeper into the substrate than the contact region.

19. The method of claim 14, further comprising forming a sheath structure in the semiconductor material surrounding the isolation structure, the sheath structure having a second, opposite, conductivity type.

20. The method of claim 14, wherein forming the isolation structure includes forming a trench in the substrate and forming the dielectric material in the trench.

21. The method of claim 20, wherein forming the isolation structure includes forming an electrically conductive material extending into the trench.

* * * * *